United States Patent
Barnett et al.

(10) Patent No.: US 11,538,601 B2
(45) Date of Patent: Dec. 27, 2022

(54) NUCLEAR MICROBATTERY

(71) Applicant: The University of Sussex, Brighton (GB)

(72) Inventors: Anna Megan Barnett, Brighton (GB); Silvia Butera, Brighton (GB); Grammatiki Lioliou, Brighton (GB)

(73) Assignee: The University of Sussex, Brighton (GB)

( * ) Notice: Subject to any disclaimer, the term of this patent is extended or adjusted under 35 U.S.C. 154(b) by 300 days.

(21) Appl. No.: 16/632,704

(22) PCT Filed: Jul. 23, 2018

(86) PCT No.: PCT/GB2018/052069
§ 371 (c)(1),
(2) Date: Jan. 21, 2020

(87) PCT Pub. No.: WO2019/016574
PCT Pub. Date: Jan. 24, 2019

(65) Prior Publication Data
US 2020/0152344 A1    May 14, 2020

(30) Foreign Application Priority Data
Jul. 21, 2017    (GB) ................................. 1711783

(51) Int. Cl.
*G21H 1/06* (2006.01)
*G21H 1/02* (2006.01)
(Continued)

(52) U.S. Cl.
CPC ............... *G21H 1/06* (2013.01); *G21G 4/02* (2013.01); *G21G 4/04* (2013.01); *G21H 1/02* (2013.01);
(Continued)

(58) Field of Classification Search
CPC ............ G21H 1/06; G21H 1/02; G21H 1/103; G21H 1/12; G21G 4/02; G21G 4/04; G21G 2001/0057; H01L 31/117
(Continued)

(56) References Cited

U.S. PATENT DOCUMENTS 2,998,550 A    8/1961    Collins et al.
3,706,893 A *  12/1972   Olsen ....................... G21H 1/06
                                                     976/DIG. 413
(Continued)

FOREIGN PATENT DOCUMENTS

WO    94/16487    7/1994

OTHER PUBLICATIONS

Butera, S. et al., "Temperature dependence of an AlInP$^{63}$Ni betavoltaic cell", Journal of Applied Physics, vol. 120, No. 144501, pp. 144501-1-144501-5, 2016.
(Continued)

*Primary Examiner* — John K Kim
(74) *Attorney, Agent, or Firm* — Diederiks & Whitelaw, PLC.

(57) ABSTRACT

A nuclear microbattery is disclosed comprising: a radioactive material that emits photons or particles; and at least one diode comprising a semiconductor material arranged to receive and absorb photons or particles and generate electrical charge-carriers in response thereto, wherein said semiconductor material is a crystalline lattice structure comprising Aluminium, Indium and Phosphorus.

28 Claims, 12 Drawing Sheets

(51) Int. Cl.
    *G21G 4/02*     (2006.01)
    *G21G 4/04*     (2006.01)
    *G21H 1/10*     (2006.01)
    *G21H 1/12*     (2006.01)
    *H01L 31/117*     (2006.01)
    *G21G 1/00*     (2006.01)

(52) U.S. Cl.
    CPC ............... *G21H 1/103* (2013.01); *G21H 1/12* (2013.01); *H01L 31/117* (2013.01); *G21G 2001/0057* (2013.01)

(58) Field of Classification Search
    USPC ......................................................... 310/303
    See application file for complete search history.

(56) References Cited

U.S. PATENT DOCUMENTS

| | | |
|---|---|---|
| 3,939,366 A | 2/1976 | Ato et al. |
| 4,010,534 A | 3/1977 | Anthony et al. |
| 5,260,621 A * | 11/1993 | Little ................... H01L 31/041 136/202 |
| 8,487,507 B1 | 7/2013 | Cabauy et al. |
| 9,466,401 B1 | 10/2016 | Cabauy et al. |
| 2010/0218819 A1 * | 9/2010 | Farmer ............. H01L 31/02167 257/434 |
| 2011/0298332 A1 * | 12/2011 | Miller ...................... G21H 1/06 310/303 |
| 2015/0001988 A1 | 1/2015 | Cabauy |
| 2015/0310952 A1 * | 10/2015 | Cabauy ................... G21H 1/06 310/303 |
| 2015/0380582 A1 | 12/2015 | Gaspari |
| 2016/0013336 A1 * | 1/2016 | Sato ................... H01L 31/1896 136/262 |
| 2018/0005720 A1 * | 1/2018 | Cabauy ................... G21H 1/06 |
| 2020/0152344 A1 * | 5/2020 | Barnett ................... G21G 4/02 |

OTHER PUBLICATIONS

Butera, S. et al., "$Al_{0.52}In_{0.48}P^{55}$ x-ray-photovoltaic battery", Journal of Physics, vol. 49, No. 355601, pp. 1-7, 2016.

* cited by examiner

NUCLEAR MICROBATTERY

CROSS-REFERENCE TO RELATED APPLICATIONS

This application represents the U.S. National Phase of International Application number PCT/GB2018/052069 entitled "Nuclear Microbattery" filed 23 Jul. 2018, which claims benefit to Great Britain Application No. 1711783.9 filed 21 Jul. 2017, all of which are incorporated herein by reference.

FIELD OF THE INVENTION

The present invention relates generally to a nuclear microbattery that comprises a radioisotope and one or more diode, wherein the radioisotope decays to produce photons or particles that are received at the one or more diode for generating a current.

BACKGROUND

The ability to supply small amounts of power over long periods of time is becoming increasingly important in many applications, including microelectromechanical system technologies, biomedical and aerospace applications. Nuclear microbatteries, which convert nuclear energy to electrical energy, may be used in these scenarios. In a nuclear microbattery, a radioactive source is coupled to a conversion material which absorbs the high energy particles emitted by the radioactive source and generates an electrical current. In contrast to traditional power supplies, such as chemical batteries, nuclear microbatteries offer important characteristics such as high energy density, stability, resistance to damage, and a long life. For example, nuclear micro-batteries can provide small amounts of power (e.g. ~pW to ~μW) for many decades.

SUMMARY

The present invention provides a nuclear microbattery comprising:
   a radioactive material that emits photons or particles; and
   at least one diode comprising a semiconductor material arranged to receive and absorb photons or particles and generate electrical charge-carriers in response thereto, wherein said semiconductor material is a crystalline lattice structure comprising Aluminium, Indium and Phosphorus.

The inventors have realised that the use of this type of semiconductor material in a microbattery enables the microbattery to have particularly good electrical characteristics.

This is especially the case for embodiments of the microbattery in which the radioactive source emits X-rays, gamma-rays or beta particles and the semiconductor material converts these X-rays, gamma-rays or beta particles to electrical charge carriers. Although the semi-conductor material has been used in photodiodes for other applications, such as spectroscopy, it had not been realised that it can be used to provide an improved microbattery.

The radioactive material comprises a radioisotope in a sufficient concentration to provide said photons or particles to the diode such that the microbattery generates electrical power.

The absorption of the photons or particles by the semiconductor material generates electron-hole pairs.

The crystalline lattice structure may be AlInP. This material may be lattice matched with GaAs, a common semiconductor substrate, and can therefore be grown thereon with high crystalline quality. The crystalline quality of the lattice matched AlInP can be very high in comparison to group III-V nitrides, and group II-VI compounds having a similar bandgap. The doping in AlInP is also easier to control than in some other group II-VI semiconductors.

The lattice structure may have a lattice composition $Al_{0.52}In_{0.48}P$ or $Al_{0.53}In_{0.47}P$. Such compositions of AlInP enable the material to be substantially lattice-matched to and grown on conventional substrates, such as GaAs. These proportions also enable the AlInP to be grown with high crystalline quality and/or to a relatively large thickness. This is particularly useful as it may be desired to provide a relatively thick layer of AlInP in order to increase the probability that any given photon or particle from the radioactive material will be absorbed. However, it is contemplated that the AlInP material may be a crystalline structure having a lattice composition $Al_xIn_{1-x}P$, wherein x is a value other than 0.5.

The AlInP may have been formed on a substrate, desirably a semiconductor substrate, such as GaAs.

The microbattery may comprise electrodes for collecting an electrical current generated by said at least one diode due to the generation of said electrical charge-carriers.

The at least one diode may comprise a plurality of the diodes electrically connected in parallel or series. The microbattery may comprise $\geq 2$, $\geq 3$, $\geq 4$, $\geq 5$, $\geq 10$, $\geq 15$, $\geq 20$, $\geq 30$, $\geq 40$, $\geq 50$, $\geq 100$, $\geq 150$, or $\geq 200$ diodes.

The at least one diode may comprise a plurality of the diodes, wherein one or more of the diodes is arranged on a first side of the radioactive material, and wherein one or more of the diodes is arranged on a second, opposite side of the radioactive material.

A gap may be arranged between said at least one diode and the radioactive material, and the gap may be filled with a gas maintained at sub-atmospheric pressure. A vacuum is maintained in the gap such that it is maintained at sub-atmospheric pressure (relative to the air pressure at sea level).

A gap may be arranged between said at least one diode and the radioactive material, and the gap may be filled with a noble gas. For example, the noble gas may be Helium.

A gap may be arranged between said at least one diode and the radioactive material, and the gap may be filled with a radioactive gas. For example, the gas may be Tritium. In this embodiment, said radioactive material may be a source of beta particles, as beta particles have a relatively long mean free path length through Tritium.

In embodiments wherein diodes are arranged on opposite sides of the radioactive material, gaps may be provided on either side of the radioactive material and one or both of these gaps may be at sub-atmospheric pressure and/or filled with the noble gas and/or filled with a radioactive gas.

The radioactive material and at least one diode may be housed within a common housing, and said housing may be arranged and configured to substantially prevent said photons or particles from the radioactive material from leaving the housing; or the micro-battery may comprise a shield member arranged and configured to substantially prevent said photons or particles from the radioactive material passing through the shield member.

The housing or shield member may be metal, such as sheet metal or a metal foil. For example, the metal may be Aluminium, steel (e.g. stainless steel) or Tungsten. However, it is contemplated that other metals or other materials may be used, provided that they prevent the photons or particles from the radioactive material passing therethrough. For example a ceramic housing or shield may be used.

The at least one diode may comprise a PIN junction or p-n junction formed by said crystalline lattice structure.

The PIN (e.g. p$^+$-i-n$^+$) junction may be formed by an undoped layer of AlInP arranged directly between a p-doped layer of AlInP and an n-doped layer of AlInP.

The inclusion of the intrinsic i-layer in the PIN junction may be used to provide a relatively large depletion zone and hence a relatively large volume to absorb the photons or particles from the radioactive material and generate the charge-carriers in response thereto.

However, it is also contemplated that the AlInP may be provided in the form of a p-n junction. The p-n junction may be formed by a p-doped layer of AlInP contacting an n-doped layer of AlInP. Alternatively, the AlInP material may be provided with a junction in the form of a Schottky contact.

The i-layer of the PIN junction may have a thickness of: $\geq 5$ μm, $\geq 10$ μm, $\geq 15$ μm, $20$ μm, $\geq 25$ μm, $\geq 30$ μm, $\geq 35$ μm, $\geq 40$ μm, $\geq 45$ μm, or $\geq 50$ μm; and/or the i-layer of the PIN junction may have a thickness of: $\leq 50$ μm; $\leq 45$ μm; $\leq 40$ μm; $\leq 35$ μm; $\leq 30$ μm; $\leq 25$ μm; $\leq 20$ μm; $\leq 15$ μm; $\leq 10$ μm; or $\leq 5$. Any one of the lower ranges of thickness listed above may be combined with any one of the upper ranges of thickness listed above, provided that they are not mutually exclusive.

Embodiments are contemplated wherein the i-layer has thickness of $\geq 6$ μm, $\geq 8$ μm or $\geq 23$ μm.

Providing such a relatively thick i-layer enables a relatively high proportion of incident photons or particles to be absorbed so that a relatively high number or charge-carriers are generated and the diode is relatively efficient at generating a current from the photons or particles.

The relatively high thickness provides the device with a high quantum efficiency for various different types of radioactive source (e.g. an X-ray or beta source).

The semiconductor material provides a relatively high attenuation coefficient for the photons or particles emitted by the radioactive source, particularly for X-rays.

The p-layer and/or n-layer of the PIN junction may have a thickness of: $\leq 0.5$ μm, $\leq 0.4$ μm, $\leq 0.3$ μm, $\leq 0.2$ μm, or $\leq 0.1$ μm.

Providing such relatively thin layers limits the absorption of photons or particles by these layers. For example, if the p-layer (or n-layer) is arranged on the side of the junction that is towards the radioactive source, then the use of a relatively thin p-layer (or n-layer) will absorb a relatively small proportion of the photons or particles such that a greater proportion of the incident photons or particles are able to pass into the i-layer of the PIN junction to be absorbed therein and generate the charge-carriers (although it is contemplated herein that part of the p-layer may also actively contribute to the generation of useful charge-carriers).

The microbattery may comprise an electrode on either side of the PIN junction or p-n junction for applying a voltage across the junction and/or for collecting an electrical current due to the charge-carriers generated in the junction, wherein at least one of the electrodes does not cover a portion of the side of the junction on which it is located such that said photons or particles can pass into the junction through said side without passing through said at least one electrode.

The at least one electrode may be annular, apertured, recessed or interdigitated so as not to cover the entirety of said side and to allow said photons or particles to pass into the junction without passing through the material forming the electrode. For example, the at least one electrode may only extend around the perimeter of the side of the junction on which it is located.

The at least one electrode may cover $\leq x$ % of the area of said side of the junction on which it is located, wherein x is selected from: 40; 35; 30; 25; 20; 15 and 10.

The microbattery may have a forward bias voltage applied across the PIN or p-n junction, wherein said voltage may be one of: $\geq 0.1$ V; $\geq 0.2$ V; $\geq 0.3$ V; $\geq 0.4$ V; $\geq 0.5$ V; $\geq 0.6$ V; $\geq 0.7$ V; $\geq 0.8$ V; $\geq 0.9$ V; $\geq 1$ V; $\geq 1.1$ V; $\geq 1.2$ V; $\geq 1.3$ V; $\geq 1.4$ V; $\geq 1.5$ V; $\geq 1.6$ V; $\geq 1.7$ V; $\geq 1.8$ V; $\geq 1.9$ V; and $\geq 2$ V; and/or $\leq 0.1$ V; $\leq 0.2$ V; $\leq 0.3$ V; $\leq 0.4$ V; $\leq 0.5$ V; $\leq 0.6$ V; $\leq 50.7$ V; $\leq 50.8$ V; $\leq 50.9$ V; $\leq 51$ V; $\leq 1.1$ V; $\leq 1.2$ V; $\leq 1.3$ V; $\leq 1.4$ V; $\leq 1.5$ V; $\leq 1.6$ V; $\leq 1.7$ V; $\leq 1.8$ V; $\leq 1.9$ V; and $\leq 2$ V. Any one of the ranges having the upper limit may be combined with any one of the ranges having the lower limit, wherein they are not mutually exclusive.

Each of the at least one diodes may have a mesa diode structure. Alternatively, the at least one diode may be formed by ion implantation or may be a planar device with Schottky contacts.

The diode may comprise one or more layers for forming an electrical contact on each side of the semiconductor material. For example, the one of more layer may comprise at least one metal layer and/or at least one semiconductor layer. Examples of metal layers include gold and titanium. Examples of a semiconductor layer includes GaAs or InGe.

A bonding layer may be provided between the one or more layers for forming the electrical contact and the semiconductor material (e.g. the AlInP), for enabling the electrical contacts to bond well to the semiconductor material (e.g. the AlInP). The bonding layer may be a metal or a semiconductor, such as GaAs. One of the bonding layers may be the substrate on which the semiconductor material (e.g. the AlInP) was formed.

The surface of each of the at least one diode facing the radioactive material may be substantially polygon shaped.

The polygon shaped surface may have rounded corners. This helps prevent electrical breakdown at the corners.

The polygon shaped surface may have at least 5 sides or at least 6 sides. This enables the battery to include multiple diodes in closer proximity to each other, thus enabling the size to power ratio of the battery to be optimised.

The radioactive material may be located within X mm of the diode semiconductor material, wherein X is selected from: $\leq 5$; $\leq 4$; $\leq 3$; $\leq 2$; $\leq 1$; $\leq 0.8$; $\leq 0.7$; $\leq 0.6$; $\leq 0.5$; $\leq 0.4$; $\leq 0.3$; $\leq 0.2$; and $\leq 0.1$.

The radioactive material may be a source of X-rays and/or gamma-rays or a source of beta particles and/or neutrons.

Such embodiments have benefits over microbatteries that convert alpha-particles and beta-particles to charge-carriers as alpha-particles may cause a relatively high level of damage to the device and beta-particles may cause an ionisation trail along the track of the beta particle which decreases the resistivity of the battery and degrades the battery voltage.

However, it is contemplated that the radioactive source may be a source of alpha particles.

The nuclear microbattery diode may directly convert the photons or particles emitted from the radioactive material to electricity (via semiconductor material), or it may first convert the photons or particles emitted from the radioactive material to other types of photons or particles and those other photons or particles may impact on the semiconductor material to generate the charge carriers.

The radioactive material may be a substantially planar mass having a mass thickness selected from: $\leq 10$ mg/cm$^2$, ≤9 mg/cm$^2$, ≤8 mg/cm$^2$, ≤7 mg/cm$^2$, ≤6 mg/cm$^2$, ≤5 mg/cm$^2$, ≤4 mg/cm$^2$, ≤3 mg/cm$^2$, ≤2 mg/cm$^2$, and ≤1 mg/cm$^2$ The radioactive material may be a substantially planar mass having an apparent activity per unit area selected from: ≥1 MBq/mm$^2$; ≥2 MBq/mm$^2$; ≥3 MBq/mm$^2$; ≥4 MBq/mm$^2$; ≥5 MBq/mm$^2$; ≥6 MBq/mm$^2$; ≥7 MBq/mm$^2$; ≥8 MBq/mm$^2$; ≥9 MBq/mm$^2$; ≥10 MBq/mm$^2$; ≥12 MBq/mm$^2$; ≥14 MBq/mm$^2$; ≥16 MBq/mm$^2$; ≥18 MBq/mm$^2$; ≥20 MBq/mm$^2$; ≥25 MBq/mm$^2$; ≥30 MBq/mm$^2$; ≥35 MBq/mm$^2$; and ≥40 MBq/mm$^2$.

It will be appreciated that any one of the above mass thickness ranges may be combined with any one of the above apparent activity ranges.

It has been recognised that it is desirable for the apparent activity of the radioactive material to be high, rather than the actual activity of the radioactive material per se (due to self-absorption in the radioactive material), and that continually increasing the amount of radioactive material will not continually increase the apparent activity. Accordingly, it has been recognised that the mass thickness of the radioactive material may be optimized, so as to have a relatively low mass thickness and a good microbattery performance (i.e. a relatively high apparent activity).

The microbattery may comprise a converter for absorbing or interacting with the photons or particles emitted by the radioactive material and generating other types of photons or particles in response thereto; wherein the semiconductor material is arranged to receive and absorb said other types of photons or particles and generate the electrical charge-carriers in response thereto. For example, the converter may be a phosphor or other scintillator for absorbing or interacting with the photons or particles emitted by the radioactive material and generating photons or other particles in response thereto that are then incident on the diode.

For example, the converter may receive neutrons from the radioactive material (e.g. from an AmBe source) and generate electrons and/or gamma rays in response thereto, which are then incident on the diode to generate the charge carriers.

The converter may be a metal foil such as, for example, a Gadolinium foil.

The converter may be arranged such that the diode is not directly exposed to the radioactive material, thereby reducing damage to the diode.

The at least one diode may be a non-avalanche diode.

The microbattery may not comprise a current amplifier and does not amplify the current from the microbattery.

The microbattery may comprise an outer package defining a battery volume of: ≤50 cm$^3$, ≤40 cm$^3$, ≤30 cm$^3$, ≤20 cm$^3$, 10 cm$^3$, 5 cm$^3$, ≤4 cm$^3$, ≤3 cm$^3$, 2 cm$^3$, or ≤1 cm$^3$.

The present invention also provides a system comprising a microbattery as described herein and an electronic device connected to, or connectable to, the microbattery for being powered by the microbattery so as to perform one or more operation.

The system may be configured such that the microbattery supplies an electronic current to the electronic device without the current being amplified.

The embodiments of the present invention provide a robust, miniature and high-efficiency radioisotope microbattery for low power microelectronics. This is useful in multiple applications where chemical battery technology is not viable, e.g. due to usage patterns, environmental conditions, or limitations on power source volume or mass. The embodiments are useful in electronic devices that need a robust supply of relatively small amounts of power (e.g. supplying a power of between 1 pW and 1000 nW) over long periods of time (e.g ≥10 years), e.g. electronic medical implants, anti-tamper devices, embedded electronics, battery-backed military encryption devices, real-time clocks, asset tracking devices and locators, and sensors such as those for monitoring structural integrity or environmental contamination. The embodiments are useful in devices that experience extremes of temperature, pressure, vibrations or other harsh environments in use, e.g. smart munitions or smart weapons, precision guided weapon systems and multi-mission capable munitions, encryption keys in microelectronic devices, monitors for nuclear waste storage or other extreme environments such as volcanoes and geological faults. The embodiments are useful where long periods of standby power are required, e.g. to augment a primary power source of chemical batteries.

The microbatteries disclosed herein may be used in a number of industries, such as in military applications, aerospace applications, microelectromechanical system technologies, and biomedical applications.

BRIEF DESCRIPTION OF THE DRAWINGS

Various embodiments will now be described, by way of example only, and with reference to the accompanying drawings in which.

DETAILED DESCRIPTION

Figure 1:
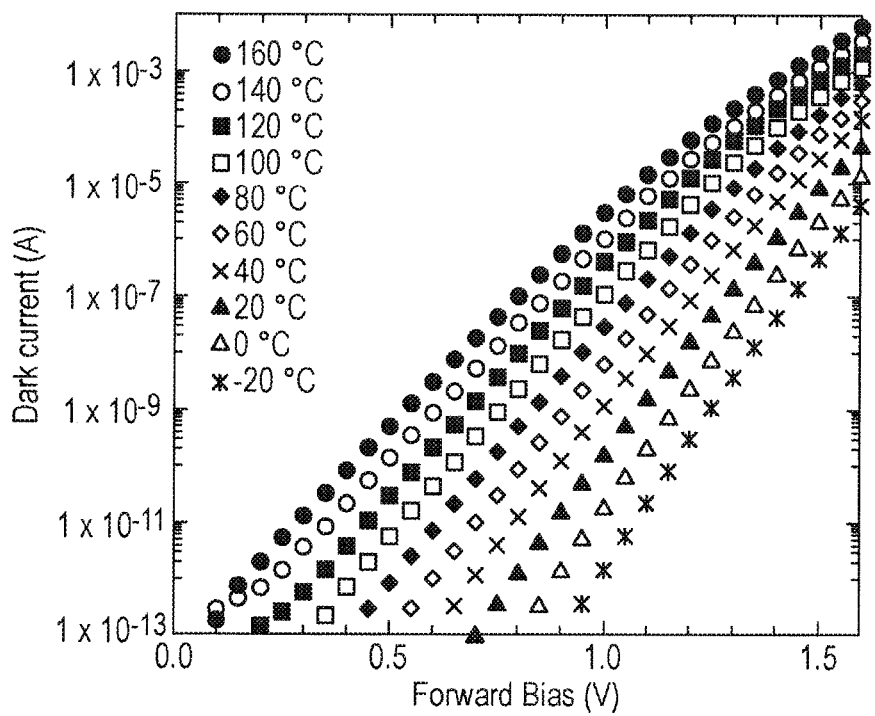
FIG. 1 shows the typical dark current characteristics for a photodiode according to an embodiment as a function of forward bias at different temperatures.

In the embodiments of the present invention, the nuclear microbattery comprises a radioactive source for emitting photons or particles and at least one diode for receiving those photons or particles and converting their energy into electrical energy.

An exemplary embodiment of a nuclear microbattery will now be described, by way of example only, to assist in the understanding of the invention. In this embodiment the microbattery comprises a radioisotope for emitting X-rays and photodiodes for converting the energy of the X-rays into electricity. It will be appreciated that the invention is not limited the particular radioactive source or to a diode including all of the layers described, or the specific composition of the various layers in this example.

With reference to Table 1 below, the exemplary photodiode comprises the layers shown. An $Al_{0.52}In_{0.48}P$ wafer layer (layers 3-5 in Table 1) was grown by metalorganic vapour phase epitaxy (MOVPE) on an n$^+$ doped GaAs:Si substrate (layer 6 in Table 1) with a misorientation of 10 degrees towards <1 1 1>A to suppress the CuPt-like ordered phase, so as to form a p$^+$-i-n$^+$ structure. The layers of the $Al_{0.52}In_{0.48}P$ wafer were successively grown on the GaAs substrate so as to form a silicon doped n$^+$ layer of $Al_{0.52}In_{0.48}P$ having a doping concentration of $2\times10^{18}$ cm$^{-3}$ and a thickness of 0.1 μm (layer 6 in Table 1), followed by an intrinsic layer of $Al_{0.52}In_{0.48}P$ having no doping and a thickness of 2 μm (layer 4 in Table 1), followed by a zinc p$^+$ doped layer of $Al_{0.52}In_{0.48}P$ having a doping concentration of $5\times10^{17}$ cm$^{-3}$ and a thickness of 0.2 μm (layer 3 in Table 1). A highly doped zinc p$^+$ doped layer of GaAs having a doping concentration of $1\times10^{18}$ cm$^{-3}$ and a thickness of 0.01 μm (layer 2 in Table 1) was grown on top of the p$^+$ doped layer of $Al_{0.52}In_{0.48}P$ (layer 3 in Table 1) to facilitate Ohmic contacting. Chemical wet etching techniques were then used to etch the layers to fabricate two circular mesa photodiodes having diameters of 400 μm. A 1:1:1 solution of $H_3PO_4$: $H_2O_2$:$H_2O$, followed by 10 s in a 1:8:80 solution of $H_2SO_4$: $H_2O_2$:$H_2O$ were used to etch the circular mesa photodiodes.

An Ohmic top contact was formed on the highly doped layer of GaAs (layer 2 in Table 1) by depositing both a layer of gold having a thickness of 0.2 μm and a layer of titanium having a thickness of 0.02 μm to form an Au/Ti alloy contact (element 1 in Table 1). The top Ohmic contact covered 33% of the surface of each 400 μm diameter photodiode. An Ohmic rear contact was formed on the rear of the GaAs substrate (layer 6 in Table 1) by depositing a layer of InGe having a thickness of 0.02 μm (layer 8 in Table 1) and a layer of gold having a thickness of 0.2 μm (layer 8 in Table 1).

TABLE 1

| Layer | Material | Thickness (μm) | Dopant | Dopant Type | Doping density (cm$^{-3}$) |
|---|---|---|---|---|---|
| 1 | Au/Ti | 0.22 | | | |
| 2 | GaAs | 0.01 | Zn | p$^+$ | $1 \times 10^{19}$ |
| 3 | $Al_{0.52}In_{0.48}P$ | 0.2 | Zn | p$^+$ | $5 \times 10^{17}$ |
| 4 | $Al_{0.52}In_{0.48}P$ | 2 | undoped | | |
| 5 | $Al_{0.52}In_{0.48}P$ | 0.1 | Si | n$^+$ | $2 \times 10^{18}$ |
| 6 | Substrate n$^+$ GaAs | | | n$^+$ | |
| 7 | InGe | 0.02 | | | |
| 8 | Au | 0.2 | | | |

Each of the two 400 μm diameter unpassivated mesa photodiodes were formed on the same chip and illuminated by a 238 MBq $^{55}$Fe radioisotope X-ray source (Mn Kα=5.9 keV, Mn Kβ=6.49 keV). The X-ray source was located 5 mm away from top surface of the photodiodes.

The X-ray quantum efficiency of a semiconductor photodetector is defined as the percentage of X-ray photons absorbed by the photodetector. Using the BeerLambert law and assuming complete charge collection in the active p-layer and i-layer, X-ray quantum efficiencies of 20% and 16% were calculated for each photodiode for 5.9 keV and 6.49 keV photons, respectively, considering the GaAs dead region. The quantum efficiency (QE) values were calculated according equation (1) below, taking into account that 33% of each photodiode surface was covered by the top metal contact. The quantum efficiency is represented as:

$$QE = [0.67 + 0.33_{exp}(-\mu_{Ti}d_{Ti})\exp(-\mu_{Au}+d_{Au})]\exp(-\mu_{GaAs}d_{GaAs})(1-\exp(-\mu_{AlInP}d_{AlInP})) \quad (1)$$

where $\mu_{Ti}$ and $d_{Ti}$ are the linear attenuation coefficient and thickness of Ti, $\mu_{Au}$ and $d_{Au}$ are the linear attenuation coefficient and thickness of Au, $\mu_{GaAs}$ and $d_{GaAs}$ are the linear attenuation coefficient and thickness of GaAs, $\mu_{AlInP}$ and $d_{AlInP}$ are the linear attenuation coefficient and the thickness of the active region of $Al_{0.52}In_{0.48}P$. The $Al_{0.52}In_{0.48}P$ attenuation coefficients, used to calculate the quantum efficiency at 5.9 keV and 6.49 keV, were estimated to be 0.1301 μm$^{-1}$ and 0.1004 μm$^{-1}$ (at a compound density of 3.66 g/cm$^3$). The attenuation coefficients, used to calculate the quantum efficiency at 5.9 keV, for GaAs, Ti and Au were estimated to be 0.0837 μm$^{-1}$, 0.2081 μm$^{-1}$, and 0.8832 μm$^{-1}$, respectively. The attenuation coefficients, used to calculate the quantum efficiency at 6.49 keV, for GaAs, Ti and Au were estimated to be 0.0645 μm$^{-1}$, 0.1684 μm$^{-1}$, and 0.718 μm$^{-1}$, respectively.

The microbattery was investigated over the temperature range of from −20° C. to 160° C. using a TAS Micro MT climatic cabinet with a dry nitrogen atmosphere (relative humidity <5%). At each analysed temperature, the dark current and illuminated current characteristics of each p$^+$-i-n$^+$ photodiode were measured as a function of applied voltage bias. Forward bias measurements from 0V to 1.6V were made in 0.01V increments using a Keithley 6487 picoammeter/voltage source. The uncertainty associated with the current readings was 0.3% of their values plus 400 fA, while the uncertainty associated with the applied biases was 0.1% of their values plus 1 mV.

FIG. 1 shows the typical dark current characteristics for one of the photodiodes as a function of forward bias at different temperatures. It can be seen that the dark currents increase as a function of applied bias, due to the greater electric fields across the intrinsic region in each photodiode. The dark currents through the photodiodes also increased with temperature due to the higher thermal energy available.

For each temperature, a linear least square fit on the dark current data as a function of applied bias was used to extrapolate the saturation current ($I_0$) in both photodiodes.

Figure 2:
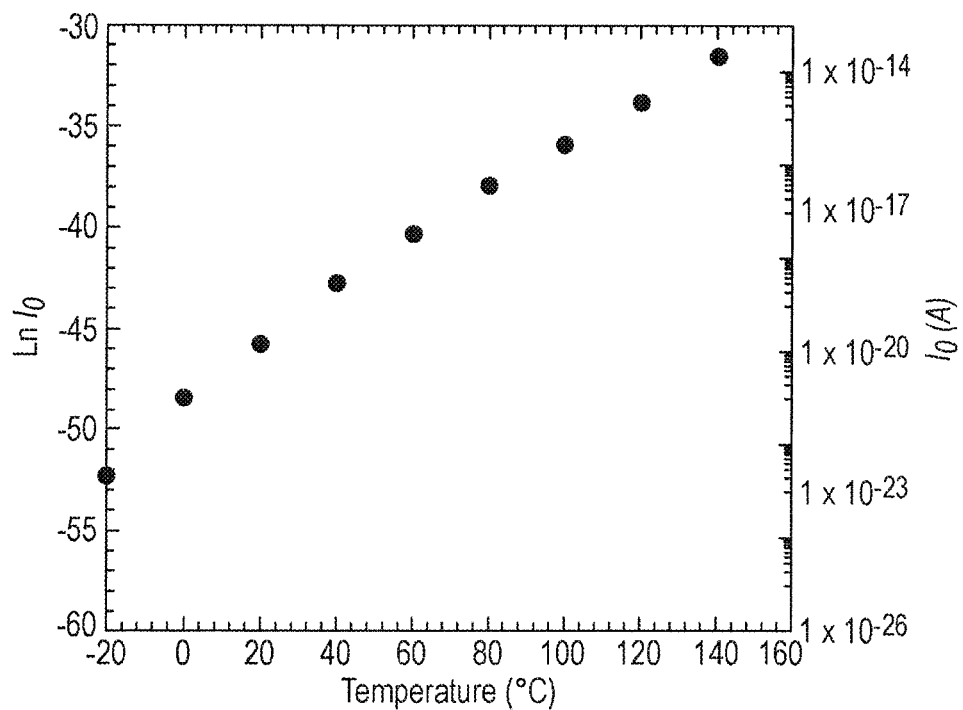
FIG. 2 shows the relationship between the logarithm of the saturation current and temperature for the photodiode.

FIG. 2 shows the measured relationship between the logarithm of the saturation current ($I_0$) and temperature for one of the photodiodes. FIG. 2 also shows the relationship between the saturation current ($I_0$) and temperature for one of the photodiodes. The magnitude of the observed natural logarithm of the saturation current decreased at higher temperatures. From −20° C. to 160° C. this decrease was 22.19±0.13 for one of the photodiodes and 22.18±0.10 for the other photodiode. These values were in remarkable agreement with the expected decrease 22.27, which was calculated using the assumption that the temperature dependence of the saturation current was proportional to $\exp(-E_g/2kT)$.

Figure 3:
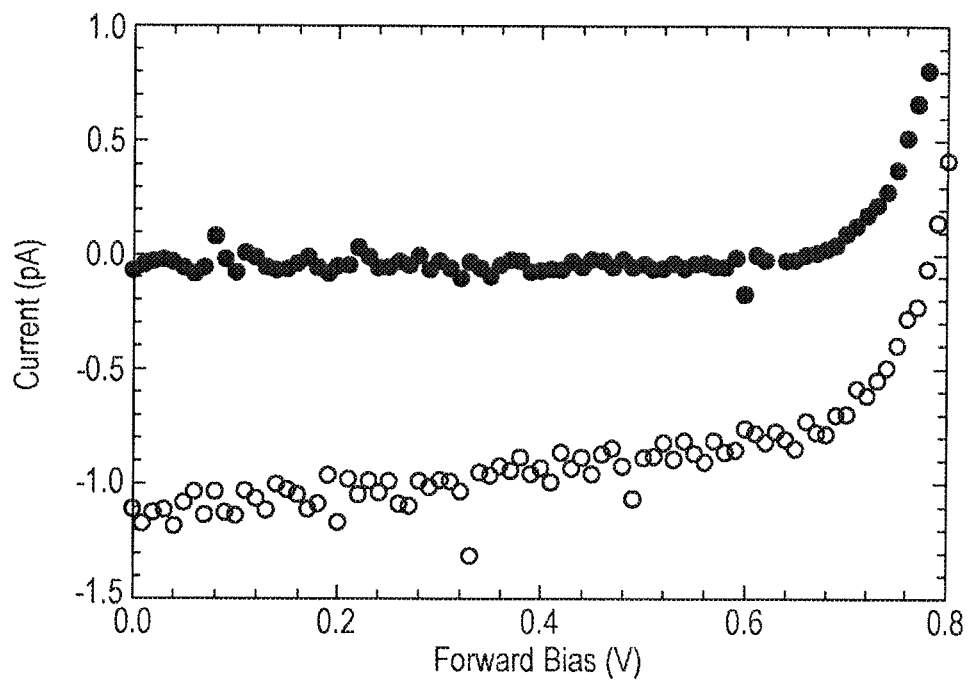
FIG. 3 shows typical dark current and illuminated current characteristics as a function of applied bias for the photodiode.

FIG. 3 shows typical dark current (filled circles) and illuminated current (empty circles) characteristics as a function of applied bias for one of the photodiodes at 20° C. It can be seen that as the forward bias is increased, the dark current is relatively stable until it then increases exponentially as a function of applied bias. The dark current increases exponentially is a manner proportional to $\exp\{qV/nkT\}$, where n is the ideality factor, k is the Boltzmann constant and T is the temperature. For both diodes, a linear least squares fit of the data showed that the natural logarithm of the dark current was linearly dependent on the applied forward bias. The gradients determined by the linear least squares fits were (22.23±0.10) $AV^{-1}$ and (22.36±0.07) $AV^{-1}$ for the two photodiodes, respectively. Ideality factors as high as 1.779±0.008 and 1.769±0.006 were estimated for these photodiodes, respectively. These ideality factors (close to 2) indicated that generation-recombination currents were dominant over the diffusion currents in the devices. Under the illumination of the $^{55}$Fe radioisotope X-ray source, the measured current through each of the photodiodes (empty circles in FIG. 3) increased, as the photocurrent is added to the dark current. When illuminated the X-ray photons were absorbed by the photodiode, creating electron-hole pairs as a consequence of the photoelectric effect. The electrons and holes in the depletion region were thus swept to the $p^+$-type and $n^+$-type regions, respectively, generating the observed photocurrent.

Figure 4:
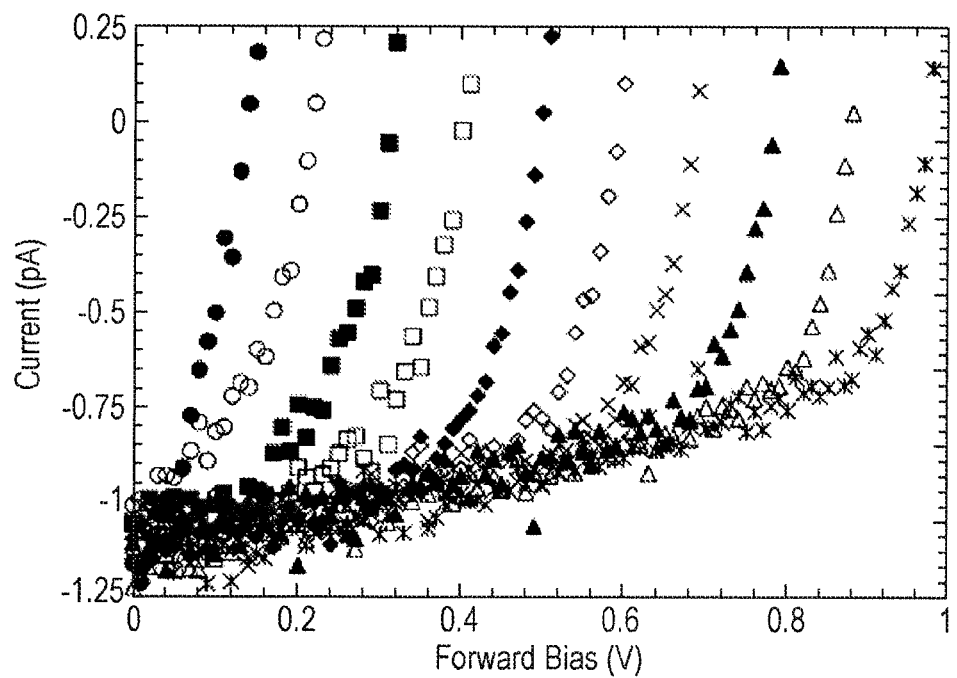
FIG. 4 shows typical current characteristics as a function of forward bias at different temperatures for the photodiode.

FIG. 4 shows typical current characteristics as a function of forward bias at different temperatures between −20° C. to 160° C. for one of the photodiodes whilst illuminated by the X-ray source. The data for 160° C. is shown as filled circles, 140° C. as empty circles, 120° C. as filled squares, 100° C. as empty squares, 80° C. as filled rhombuses, 60° C. as empty rhombuses, 40° C. as crosses, 20° C. as filled triangles, 0° C. as empty triangles and −20° C. as stars. It can be seen that at increased temperatures, the softness in the knee of the measured current as a function of applied forward bias decreases in the photodiode. The experimental values of the open circuit voltage were obtained as the intercept of the curves in FIG. 4 on the horizontal axis.

Figure 5A:
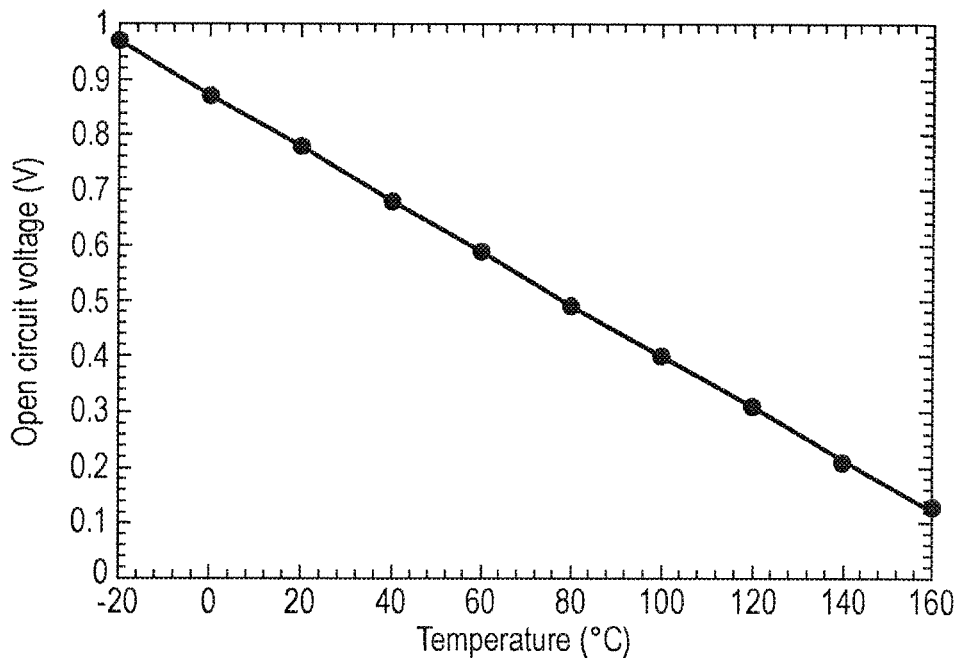
FIG. 5A shows the open circuit voltage as a function of temperature for the photodiodes.

FIG. 5A shows the open circuit voltage as a function of temperature for one of the photodiodes. As temperature increases, the open circuit voltage decreases because of its dependence on the saturation current. The open circuit voltage ($V_{OC}$) increased logarithmically with decreasing saturation current ($I_0$), according the following equation:

$$V_{OC} \sim \frac{kT}{q}\ln\left(\frac{I_{ph}}{I_0}\right) \quad (2)$$

where k is the Boltzmann constant, T is the temperature, $I_{ph}$ is the photocurrent through the device and $I_0$ the saturation current.

The open circuit voltage was seen to decrease linearly with temperature. Over the temperature range from −20° C. to 160° C., the open circuit voltage $V_{OC}$=−AT+B; where A=(0.004 60±0.000 03) V ° $C.^{-1}$ and B=(0.871±0.002) V for one of the photodiodes, and where A=(0.00460±0.00002) V ° $C.^{-1}$ and B=(0.866±0.002) V for the other of the photodiodes. Open circuit voltages as high as 0.97V were observed for the photodiodes at −20° C. These values are much higher than has been previously reported (e.g. 0.3V using a GaAs $^{55}$Fe radioisotope microbattery at the same temperature). This is due to the higher bandgap of $Al_{0.52}In_{0.48}P$ with respect to GaAs.

Figure 5B:
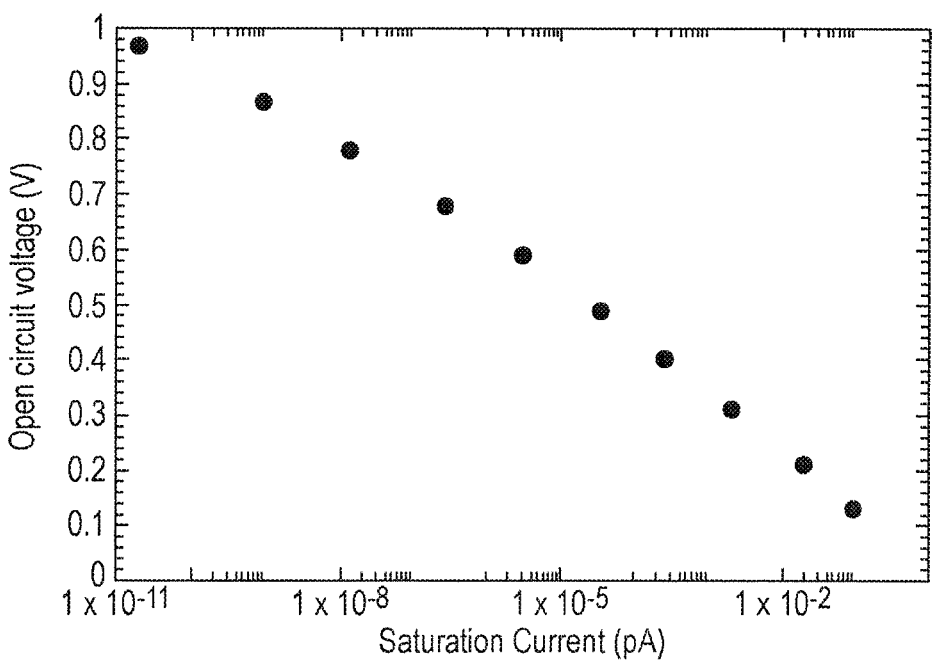
FIG. 5B shows the dependence found between the open circuit voltage and the saturation current.

FIG. 5B shows the experimental dependence found between the open circuit voltage and the saturation current.

Figure 6:
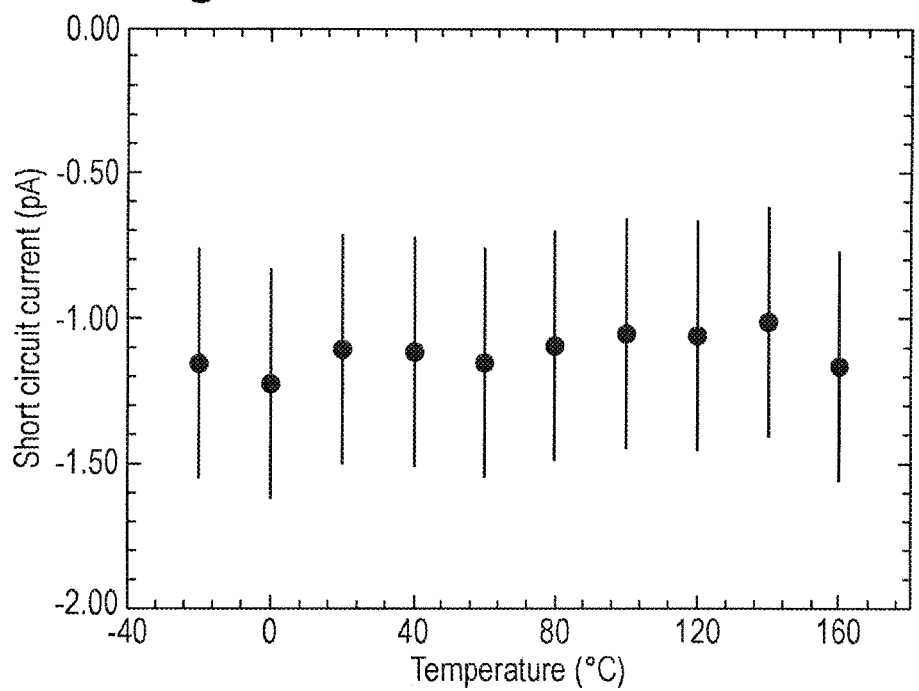
FIG. 6 shows the short circuit current as a function of temperature for the photodiodes.

FIG. 6 shows the short circuit current as a function of temperature for one of the photodiodes. These experimental values of the short circuit current were obtained as the intercept of the curves in FIG. 4 on vertical axis. An unclearly defined relationship was observed for the short circuit current with temperature, due to the relatively high uncertainty of the picoammeter in measuring low currents through the photodiodes positioned in the climatic cabinet system.

Figure 7:
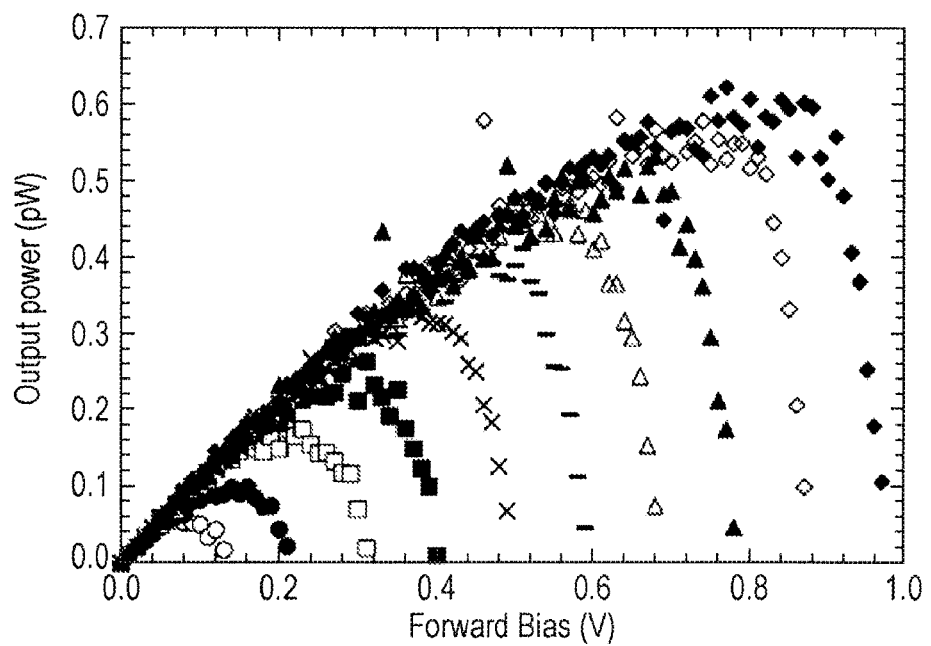
FIG. 7 shows the output power from the photodiode as a function of applied forward bias at different temperatures.

FIG. 7 shows the output power from one of the photodiodes as a function of applied forward bias at different temperatures. The data for 160° C. is shown as filled rhombuses, 140° C. as empty rhombuses, 120° C. as filled triangles, 100° C. as empty triangles, 80° C. as dashes, 60° C. as crosses, 40° C. as filled squares, 20° C. as empty squares, 0° C. as filled circles and −20° C. as empty circles. The output power from each photodiode was computed by multiplying the applied bias with the corresponding current measured through the device. As can be seen from FIG. 7, when the bias is increased, the output power increased to a maximum and then decreased.

Figure 8A:
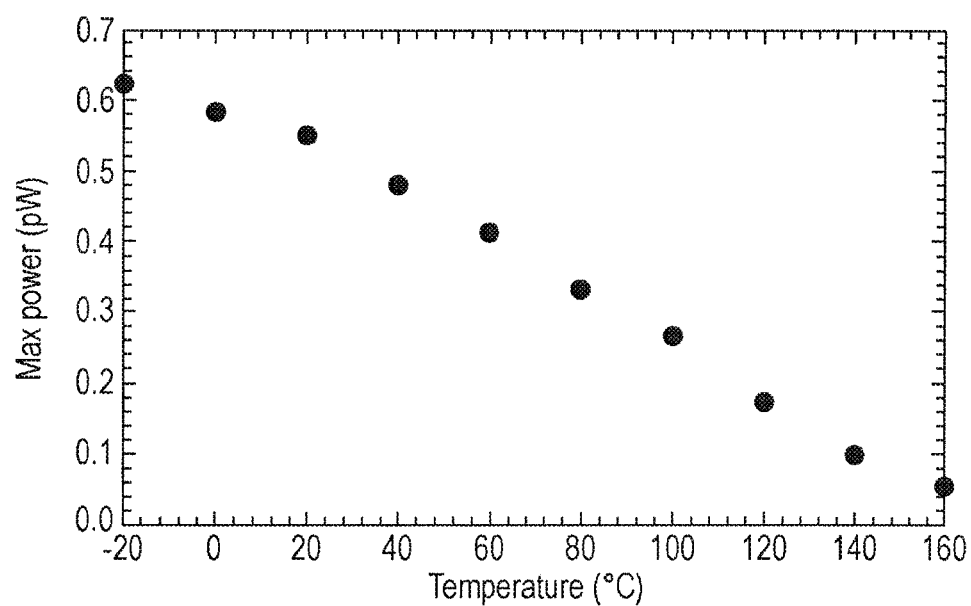
FIG. 8A shows the magnitude of the measured maximum output power as a function of temperature.

FIG. 8A shows the magnitude of the measured maximum output power as a function of temperature. As temperature increases, the magnitude of the maximum output power decreases because of its dependent on the open circuit voltage. A maximum output power as high as 0.62 pW, corresponding to 0.3 µW/Ci, was observed from the photodiode at −20° C. The output powers of the two 400 µm diameter photodiodes may be combined, resulting in a total microbattery output power of 1.2 pW (at −20° C.). The maximum output power of the photodiodes may be improved by increasing the thickness of the $Al_{0.52}In_{0.48}P$ intrinsic layer so that a greater proportion of the X-ray photons are absorbed and converted to electrical energy.

Figure 8B:
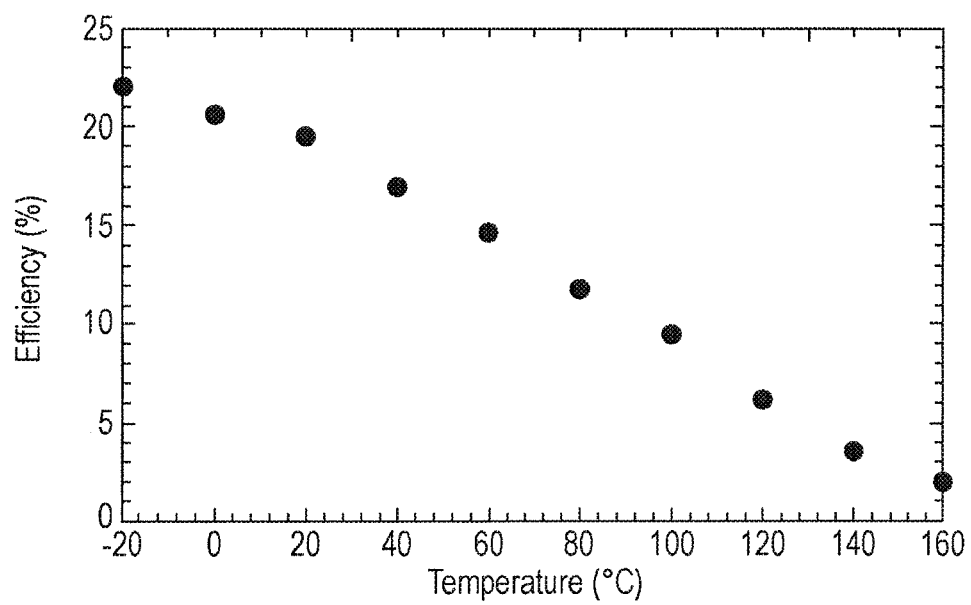
FIG. 8B shows the internal conversion efficiency as a function of temperature.

FIG. 8B shows the internal conversion efficiency as a function of temperature. The internal conversion efficiency was computed by dividing the maximum output power measured at each temperature by the maximum power ($P_{th}$) obtainable from the X-ray photons usefully absorbed by the photodiode if the photodiode conversion efficiency was 100%. $P_{th}$ was estimated knowing the activity of the source, the emission probabilities of Mn Kα and Mn Kβ X-rays from $^{55}$Fe (0.245 and 0.0338, respectively]), the thickness of the radioiso-tope X-ray source's Be window (0.25 mm), the areas of the $^{55}$Fe radioactive source and $Al_{0.52}In_{0.48}P$ mesa diode, the diode quantum efficiency and assuming an electron-hole pair creation energy of 5.8 eV (2.5 times the bandgap). $P_{th}$ was found to be 2.8 pW. As can be seen from FIG. 8B, an internal conversion efficiency as high as 22% can be obtained at −20° C.

In the embodiment described above, only 0.3% of the emitted X-ray photons impinged on the surface of the photodiodes and only 0.05% were actually absorbed in the photodiodes. The number of photons per second emitted in any direction by the source was estimated knowing the activity of the source and the emission probabilities of Mn Kα and Mn Kβ x-rays from $^{55}$Fe (0.245 and 0.0338, respectively. It was found that $6.6 \times 10^7$ photons per second are emitted by the radioactive source. Of these, around half are emitted in the direction towards the photodiodes, assuming that half of the photons are lost because they are emitted in a direction away from the photodiodes. The number of photons per second incident on the photodiodes was estimated as $1.7 \times 10^5$ per second, based on the number of photons per second emitted by the source towards the photodiodes ($3.3 \times 10^7$ per second), the thickness of the X-ray source's Be window (0.25 mm) and the geometry of the source and photodiodes.

Figure 9:
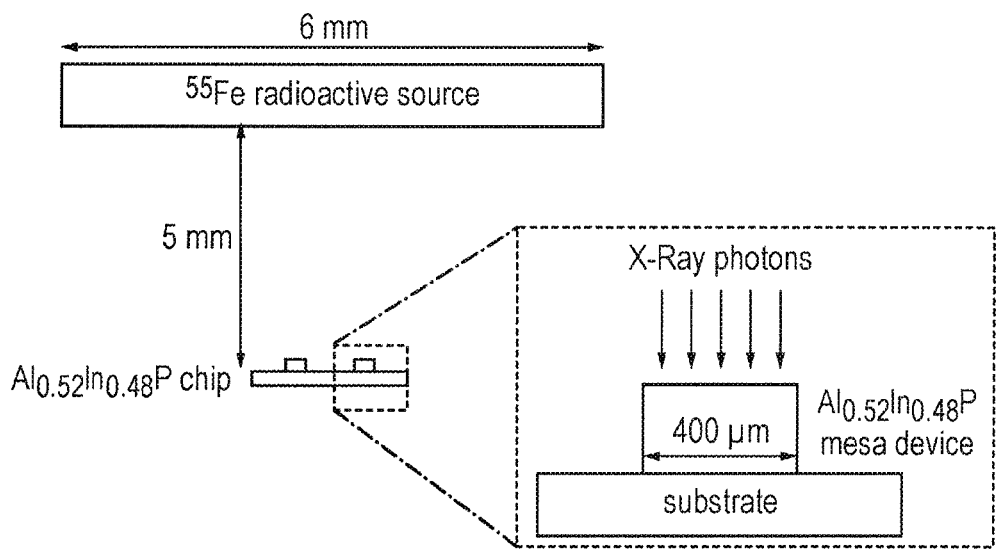
FIG. 9 shows schematically the geometry of the radioactive source and photodiodes.

FIG. 9 shows schematically the geometry of the source and detector. The ratio between the area of the photodiodes (0.25 mm$^2$) and the area of the radioactive source (28.27 mm$^2$) was calculated as 0.0089. The number of photons on the detector was estimated by multiplying 0.0089 by the number of photons per seconds transmitted through the X-ray source's Be window ($1.9 \times 10^7$ per second). The number of photons per seconds absorbed in the photodiodes was calculated using the BeerLambert law and assuming complete (100%) charge collection in the active p- and i-layers. The number of photons per second on the photodiodes was multiplied by the device quantum efficiency (calculated according equation (1) above, so that $3.4 \times 10^4$ photons per second were considered to be absorbed in the photodiodes.

Although the present invention has been described with reference to preferred embodiments, it will be understood by those skilled in the art that various changes in form and detail may be made without departing from the scope of the invention as set forth in the accompanying claims.

Different radioactive sources may be used to those described above. The radioactive source may emit photons other than X-rays. Alternatively, the radioactive source may emit alpha-particles, beta-particles or neutrons that are absorbed by the diode and converted into electrical energy.

For example, the radioactive source may be a beta-particle emitter such as $^{63}$Ni. An embodiment will now be described, wherein the microbattery comprises a $^{63}$Ni radioactive source (activity 185 MBq; electron energies up to 66 keV) arranged 3 mm from a diode as described above with reference to Table 1.

The Monte Carlo computer modelling package CASINO (version 3.3) was used to simulate the interaction of the beta electrons in the diode. The amount of beta particle energy absorbed in the AlInP i-layer in particular was studied. 4000 beta particles, of energies between 1 keV and 66 keV, were simulated as emitted from the source and incident on the p$^+$ side of the AlInP epilayer. The simulations showed that beta particles with energies below 22 keV did not reach the i-layer primarily because of the attenuation of the particles' energies in the protective inactive Ni overlayer of the beta particle source used. Attenuation in the top metal contact (covering 33% of the diode's face) and in the GaAs dead layer was a secondary effect, as well as the attenuation through the p$^+$ layer of the AlInP. Beta electrons with energy 22 keV deposited part of their energy in the i-layer. Simulations suggested that the electrons at 39 keV were the electrons that deposited the highest percentage of their energy in the i-layer (17%): beta particles with energies <39 keV lost part of their energy above the i-layer, whilst the beta particles with energies >39 keV easily passed through the 2 µm thick i-layer depositing therein only a percentage of their energy (e.g., only 8% of the energy of the 66 keV was absorbed in the i-layer). The diode structure in Table 1 is therefore optimised for the absorption of 39 keV beta electrons from the radioactive source.

However, in $^{63}$Ni the emission of 17 keV electrons is the most probable; the relative emission probability of the 39 keV electrons with respect the 17 keV electrons is 0.5. A $^{63}$Ni radioisotope beta source without a protective inactive Ni overlayer may therefore be used and/or a thicker AlInP i-layer and/or a thinner p$^+$-layer may be used so as to allow the absorption of electrons in a wider range of energies. This allows a bigger percentage of the energy released by the radioactive material to be deposited in the i-layer.

The radioisotope betavoltaic cell was studied in the temperature range of 140° C. to −20° C. using TAS Micro MT climatic cabinet to achieve and maintain the temperature investigated. Dry nitrogen was constantly flowing inside the test chamber to control the humidity of the atmosphere where the cell was tested (relative humidity <5%). A Keithley 6487 picoammeter/voltage source was used to study the cell performance. Forward bias measurements in dark conditions and under the illumination of the $^{63}$Ni radioisotope beta source were conducted at biases between 0 V and 1 V, in 0.01 V increments. The uncertainty associated with the current readings was 0.3% of their values plus 400 fA, while the uncertainty associated with the applied biases was 0.1% of their values plus 1 mV.

Figure 10:
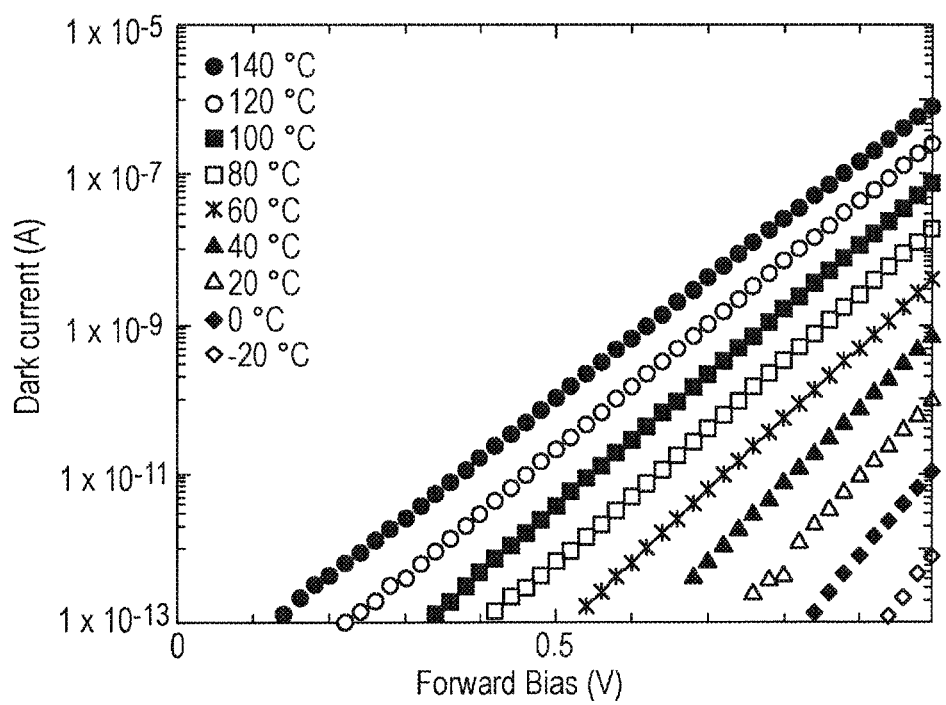
FIG. 10 shows the dark current characteristics as a function of forward bias at different temperatures for a betavoltaic cell.

FIG. 10 shows the dark current characteristics as a function of forward bias at different temperatures for the betavoltaic cell. The temperatures studied were 140° C. (filled circles), 120° C. (empty circles), 100° C. (filled squares), 80° C. (empty squares), 60° C. (crosses), 40° C. (filled triangles), 20° C. (empty triangles), 0° C. (filled rhombuses), and −20° C. (empty rhombuses). It can be seen that at high temperatures, the dark current through the device increased due to the greater thermal energy available. At increased forward bias, a greater electric field is applied across the diode's depletion region, resulting in higher dark current at each temperature.

The dark current/and the applied bias for a simple p-n diode are related by:

$$I = I_0 \exp\{qV/nkT\}$$

where $I_0$ is the saturation current, q is the electric charge, n is the ideality factor, k is the Boltzmann constant, and T is the temperature. At each temperature, the values of $I_0$ and n for the diode were experimentally estimated by performing a linear least squares fit of the natural logarithm of the measured dark current data as a function of applied forward bias. The equation above was linearised as Ln I=A+BV, with A=Ln $I_0$ and B=q(nkT)$^{-1}$, and linear least square fitting used.

Figure 11:
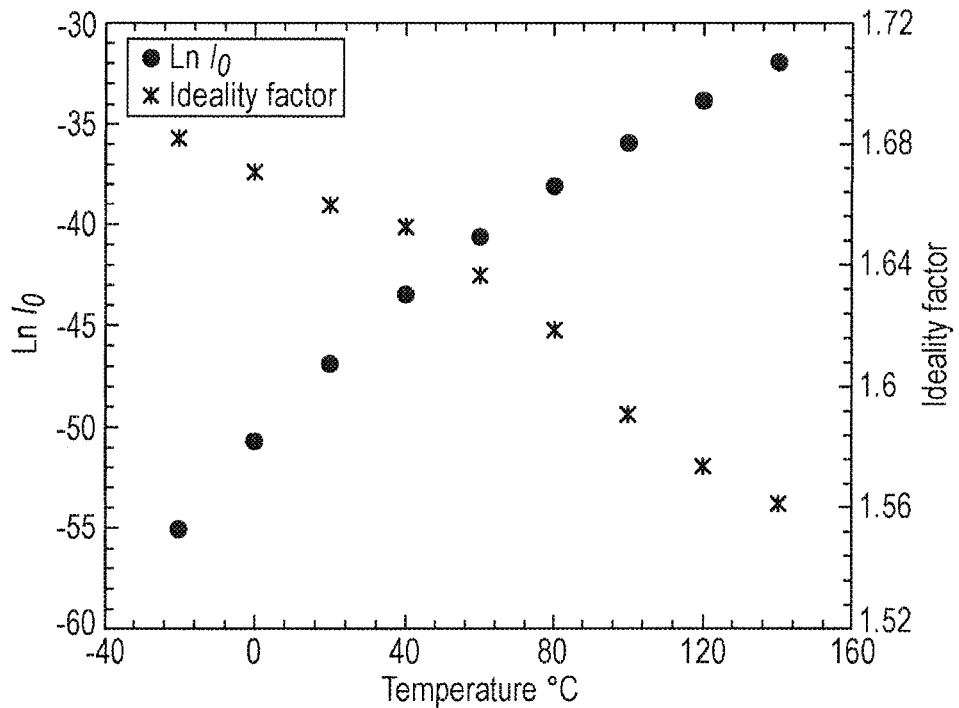
FIG. 11 shows the measured saturation current and the ideality factor as functions of temperature.

FIG. 11 shows the logarithm of the measured saturation current (left axis, filled circles) and the ideality factor (right axis, crosses) as functions of temperature, respectively. The magnitude of the natural logarithm of the saturation current increases with a decrease in temperature. The observed increase was 23.13±0.19 (corresponding to an increase in saturation current, $I_0$, of 0.013 pA) between 140° C. and −20° C. This was in remarkable agreement with the expected increase of 20.50 (corresponding to an increase in saturation current, $I_0$, of 0.008 pA). The expected increase was calculated using the simple assumption that the temperature dependence of the natural logarithm of the saturation current was proportional to $E_g/2kT$. In the same temperature range, a change in ideality factor was also observed. Since the ideality factor was >1.5 at every temperature, it can be concluded that the generation-recombination mechanism was dominant over the diffusion mechanism. The lower value of the ideality factor observed at higher temperature (1.561±0.003 at 140° C. vs 1.682±0.011 at −20° C.) may be attributed to the increased contribution of the diffusion current at increased temperature.

Figure 12:
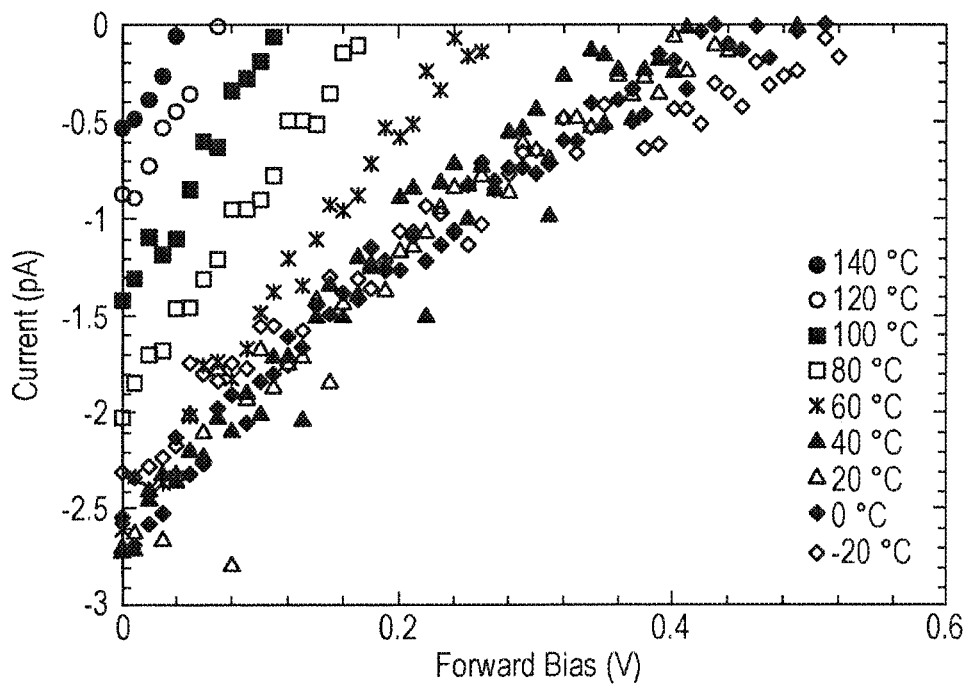
FIG. 12 shows the illuminated current characteristics as a function of forward bias at different temperatures.

FIG. 12 shows the illuminated current characteristics as a function of forward bias at different temperatures. The temperatures studied were 140° C. (filled circles), 120° C. (empty circles), 100° C. (filled squares), 80° C. (empty squares), 60° C. (crosses), 40° C. (filled triangles), 20° C. (empty triangles), 0° C. (filled rhombuses), and −20° C. (empty rhombuses). The open circuit voltage and the short circuit current were extrapolated as the interception points of the curves with the horizontal and vertical axes, respectively.

At temperatures above 40° C., the current through the device increased when the temperature was decreased. A different trend was instead observed at temperatures below 40° C. In the temperature range between 40° C. and −20° C., the measured current characteristics were noisy and overlapped each other indicating that saturation effects from beta particle induced conduction became dominant over the thermal mechanism (scattering), the significance of which was greater at higher temperatures. The beta electrons, losing energy through the AlInP structure, generated electron-hole pairs along their trajectories that decreased the resistivity in that region.

Figure 13:
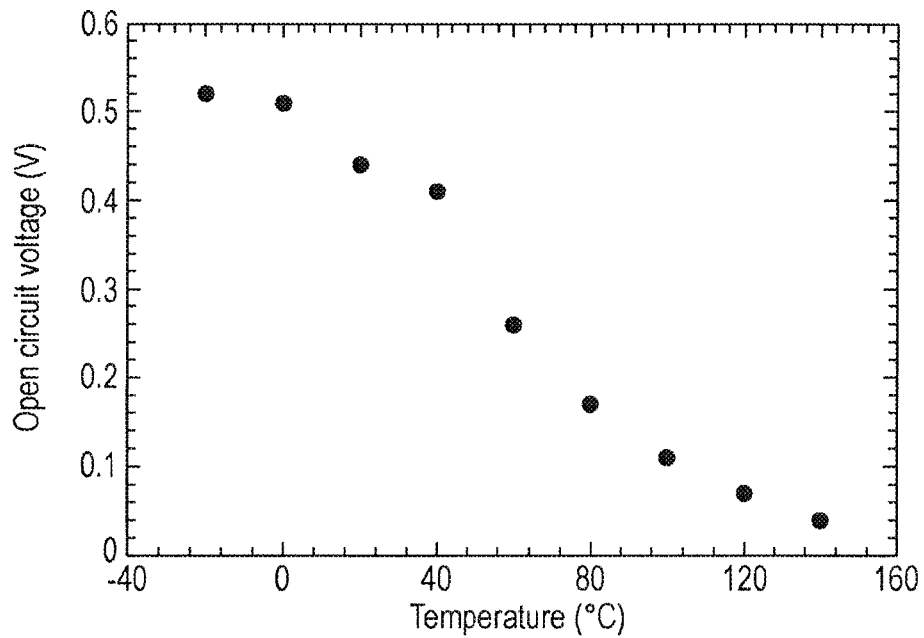
FIG. 13 shows the open circuit voltage as a function of temperature.

FIG. 13 shows the open circuit voltage as a function of temperature. The open circuit voltage decreases with increased temperature.

Figure 14:
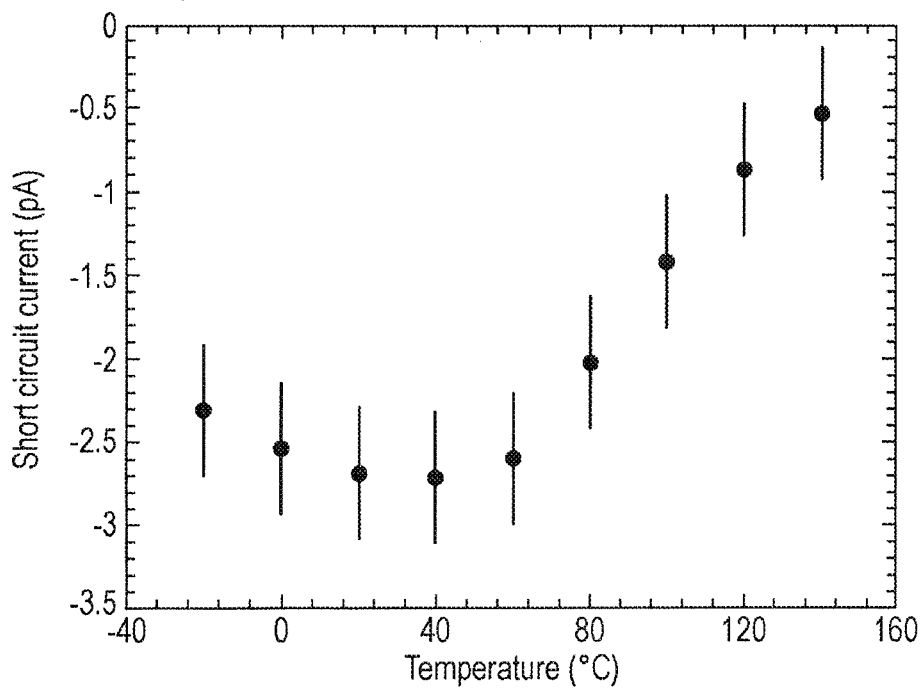
FIG. 14 shows the short circuit current as a function of temperature.

FIG. 14 shows the short circuit current as a function of temperature.

Figure 15:
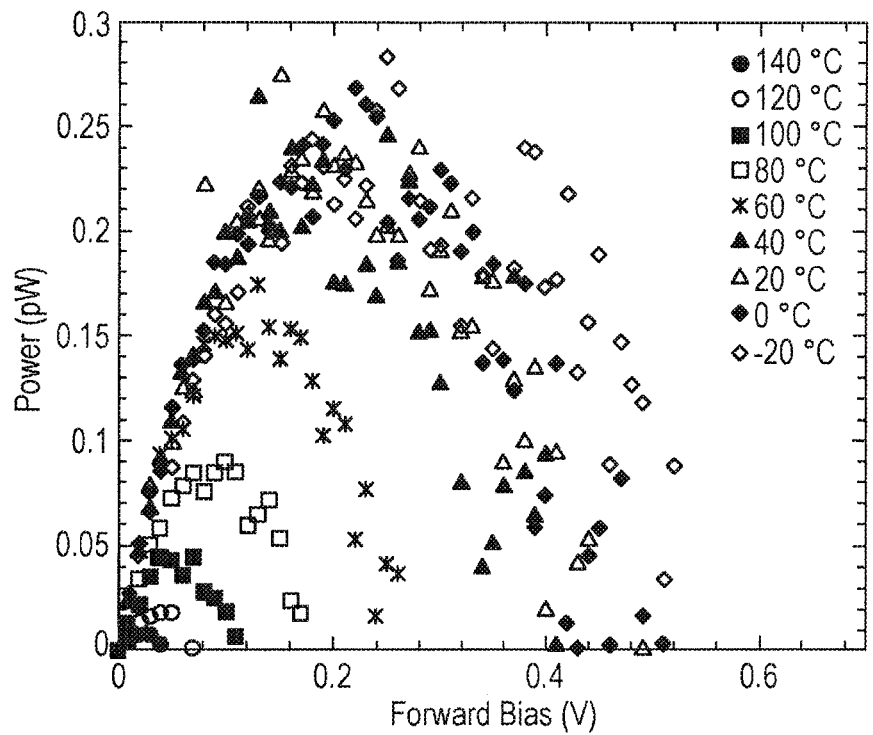
FIG. 15 shows the betavoltaic cell output power as a function of applied forward bias over a range of temperatures.

FIG. 15 shows the betavoltaic cell output power as a function of applied forward bias over a range of temperatures. The temperatures are: 140° C. (filled circles), 120° C. (empty circles), 100° C. (filled squares), 80° C. (empty squares), 60° C. (crosses), 40° C. (filled triangles), 20° C. (empty triangles), 0° C. (filled rhombuses), and −20° C. (empty rhombuses). The betavoltaic cell output power was calculated as P=IV. By increasing the applied forward bias, the cell output power increased to a maximum (Pm) and then decreased. At temperatures below 40° C., the power characteristics were noisy and overlapped each other as a consequence of the current results shown in FIG. 12.

Figure 16:
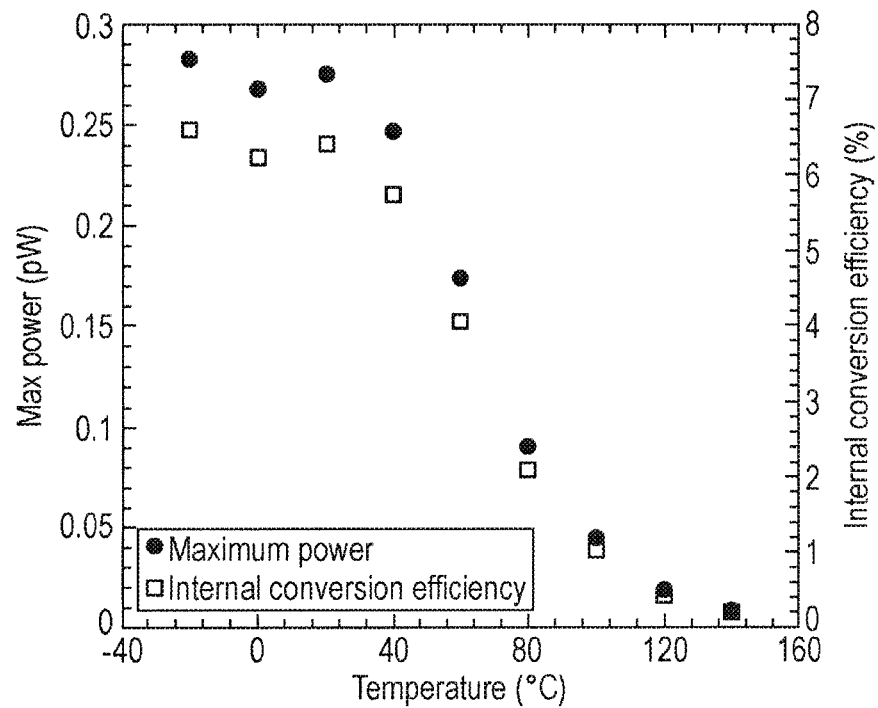
FIG. 16 shows the measured maximum output power as a function of temperature and the internal conversion efficiency of the betavoltaic cell as a function of temperature.

FIG. 16 shows the magnitude of the measured maximum output power as a function of temperature (left axis, filled circles) and the internal conversion efficiency of the betavoltaic cell as a function of temperature (right axis, empty squares). The internal conversion efficiency of the betavoltaic cell was calculated by dividing the experimental maximum output power by the maximum power ($P_{th}$). $P_{th}$ was calculated using the following equation:

$$P_{th} = \sum_{i=0}^{end\ point=66} \frac{A}{2} Em_i \frac{A_{All\ nP}}{A_{Ni}} QE_i \frac{i}{\omega_{All\ nP}} 1.6 \times 10^{-19},$$

where A is the activity of the $^{63}$Ni radioactive source (185 MBq), $Em_i$ is the emission probability of an electron of energy i, $A_{Ni}$ is the area of the radioactive source (49 mm$^2$), $A_{AlInP}$ is the area of the AlInP detector (0.13 mm$^2$), $QE_i$ is the percentage of each electron energy absorbed in the mesa device (calculated using CASINO software), and $\omega_{AlInP}$ is the AlInP electron-hole pair creation energy (5.34 eV). In the above equation, the activity of the radioactive source was halved because it was assumed that half of the electrons were lost since they were emitted away from the diode. $P_{th}$ was found to be 4.3 pW.

In FIG. 16, the magnitude of the maximum output power increased with decreasing the temperature, reaching a saturation value of 0.28 pW, corresponding to 0.11 µW/Ci, at temperatures <40° C. The behaviour observed can be explained taking into consideration the dependence of the maximum output power with respect to the open circuit voltage.

The performance of a nuclear microbattery depends, in part, on the apparent activity of the radioactive material being used to illuminate the at least one diode and, in part, on the thickness of semiconductor material for absorbing the photons or particles emitted from the radioactive material.

For a specific radioactive material, it is possible to define an actual activity and an apparent activity. The actual activity, A, gives information about the number of radioactive decays per second. At any given time, the activity after t years, A, is related to the initial activity (at t=0), $A_0$, according to:

$$A = A_0 e^{-\ln 2 \frac{t}{T_{1/2}}}$$

where $T_{1/2}$ is the half life of the radioactive material.

The apparent activity per unit area, $A_{app}$, due to self-absorption effects within the radioactive material itself, is given by:

$$A_{app} = \frac{C}{\mu_m}(1 - e^{-\mu_m t_m})$$

where C [MBq/mg] is the specific activity of the radioactive material source, $t_m$ [mg/cm$^2$] is the mass thickness of the radioactive material and $\mu_m$ [cm$^2$/mg] is the mass attenuation coefficient.

For example, for a beta particle emitting radioactive material, the mass attenuation coefficient is given by:

$$\mu_m = 0.017/E_{max}^{1.43}$$

where $E_{max}$ [MeV] is the maximum beta particle energy. A given beta radioisotope radioactve material has a specific mass attenuation coefficient (e.g. for $^{63}$Ni, $\mu_m$=0.828 cm$^2$/mg).

The specific activity depends from the purity of the radioactive material. For example, a highly pure $^{63}$Ni radioactive material may have a specific activity of 2072 MBq/mg, whereas it will be lower for a less pure $^{63}$Ni radioactive material. The specific activity of a typical commercially available $^{63}$Ni radioactive material is 481 MBq/mg.

Figure 17:
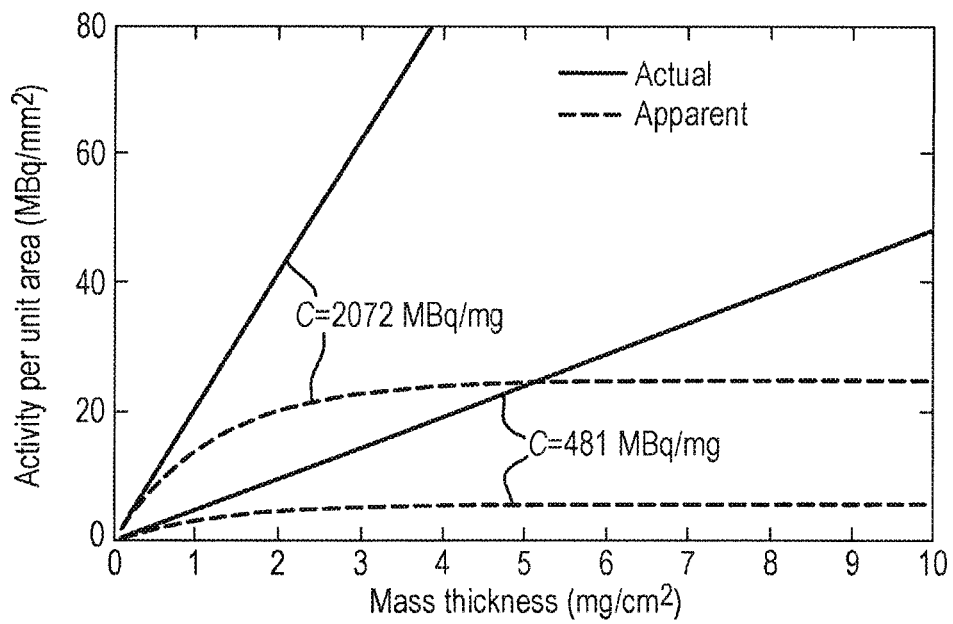
FIG. 17 shows the actual surface activity per unit area and the apparent surface activity per unit area of a $^{63}$Ni radioactive material as a function of mass thickness of the radioactive material.

FIG. 17 shows the actual apparent activity per unit area (solid lines) and the apparent activity per unit area (dashed lines) of a $^{63}$Ni radioactive material as a function of mass thickness (in mg/cm$^2$) of the radioactive material, for a material having a specific activity of 2072 MBq/mg and a material having a specific activity of 481 MBq/mg. It can be seen that the actual activity per unit area linearly increases with mass thickness, whilst the apparent activity per unit area initially linearly increases and then plateaus to a specific value as the mass thickness increases. The mass thickness of the radioactive material can therefore be selected so as to maximise the apparent activity per unit area at the lowest mass thickness possible, since higher mass thicknesses would result in a larger difference between the actual and apparent activities per unit area.

It is also important to consider the dimensions of layers of the at least one diode. For example, if the diode is a p-i-n or p-n diode, the thicknesses of the p-layer may be selected to be as thin as possible so as to reduce attenuations of the photons or particles from the radioactive material. The i-layer in a diode having a p-i-n junction may be selected to be thick enough to ensure that that a high proportion, or all, of the photons or particles emitted by the radioisotope material (e.g. even the more energetic particles/photons) are absorbed (e.g. to provide as close to 100% quantum efficiency as possible). However, a thicker i-layer will not always increase the microbattery performance and may possibly introduce different issues. For example, the charge collection efficiency can be compromised if the i-layer thickness is much bigger than the depletion region. In a diode the depletion region with no external bias is fixed by the diode built-in voltage (which is dependent on the doping concentrations). Therefore, having a depletion region much thinner than the i-layer may affect the charge collection efficiency due to recombination effects: the generated charge carriers have an high probability of recombining since they have to travel long distances through a non-depleted material before reaching the electrical contacts. Ideally, the depletion region and the i-layer thickness are matched. The epitaxial growth of a thick semiconductor structure is also difficult, and may compromise the semiconductor crystalline quality. Therefore, the use of the optimised i-layer thickness enables one to achieve high-performance microbattery systems, in which the electric output power extracted by the microbattery is maximised. For example, for a $^{63}$Ni AlInP microbattery, with the highest electron energy being 66 keV, simulations showed the optimum i-layer thickness is 23 μm.

An exemplary embodiment of a $^{63}$Ni AlInP microbattery will now be described, by way of example only, to assist in the understanding of the invention. The requirements for the microbattery were considered to be a voltage $V_m$=1.5 V and a current $I_m$=160 nA. In this embodiment the microbattery comprises an array of diodes on opposing sides of the radioactive material and connected in series, such that each array is required to generate 80 nA. However, the diodes could be located on only one side of the radioactive material.

Based on the above requirements, the required values of the open circuit voltage ($V_{OC}$) and short circuit current ($I_{SC}$) for each microbattery array can be calculated. The required open circuit voltage is calculated as:

$$V_{OC} = V_m + \frac{1}{\beta}\ln(1+\beta V_m)$$

where $\beta$=q/kT. It was determined that an open circuit voltage of 1.67 V is required.

The fill factor (i.e. the ratio of the real maximum power able to be generated to the maximum theoretical power), FF, was calculated according to:

$$FF = \frac{v_{oc} - \ln(v_{oc} + 0.72)}{v_{oc} + 1}$$

where $v_{oc}=V_{OC}\beta$. The fill factor was determined to be 0.7.

The required short circuit current, ISO, is related to the fill factor and the required values of $I_m$ and $V_m$, and is given by:

$$I_{SC} = \frac{I_m V_m}{FF V_{OC}}$$

It was found that a short circuit current of 103 nA is required for a microbattery array working with an $I_m$ of 80 nA.

Once the total $V_{OC}$ and $I_{SC}$ were calculated, the number of diode cells per microbattery array can be computed based on the activity of the radioactive material and the quantum efficiency QE of each diode cell. Each diode cell has a short circuit current and open circuit voltage of $I_{SCpp}$ and $V_{OCpp}$, respectively. Thus the microbattery array is comprised of $V_{OC}/V_{OCpp}$ cells connected in parallel to result in the required $V_{OC}$, and $I_{SC}/I_{OCpp}$ cells connected in series to result in the required ISO.

Figure 18:
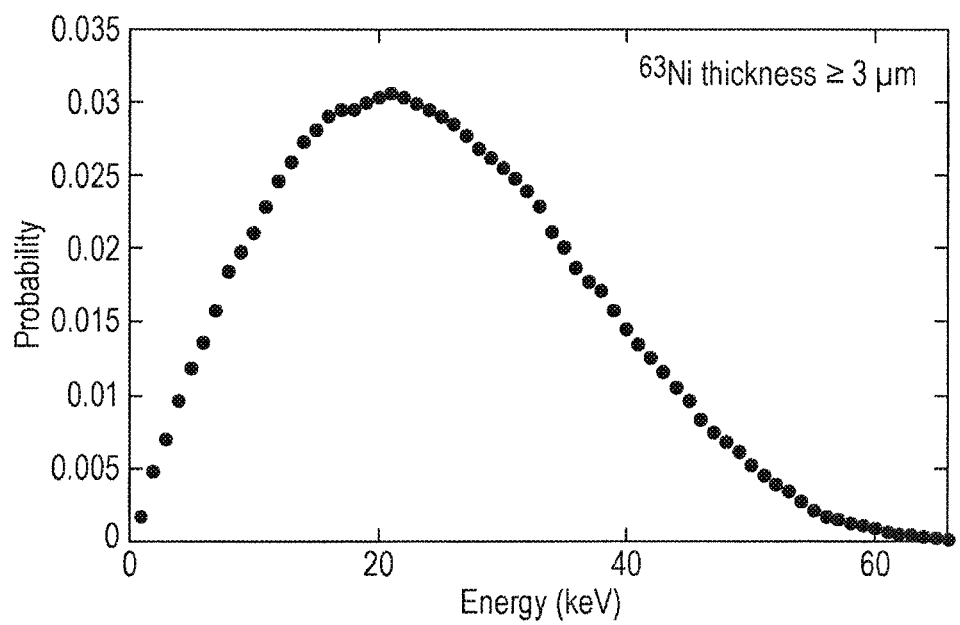
FIG. 18 shows the emission probability of a source as a function beta particle energy.

The radioactive material may be a $^{63}$Ni beta particle source having a thickness of 3 μm (although other radioactive sources and thicknesses are contemplated). The emission probability of such a source as a function beta particle energy is shown in FIG. 18. The $^{63}$Ni source would have an initial actual activity per unit area of 7.91 MBq/mm$^2$, which would reduce to 6.43 MBq/mm$^2$ after 30 years (100 year half life). A higher actual activity for the same source geometry would not result in an increased apparent activity, as can be seen from FIG. 17, due to self-absorption in the source material. A specific activity of 481 MBq/mg would result in a reduction of the activity per unit area from 6.43 MBq/mm$^2$ (actual) to 3.88 MBq/mm$^2$ (apparent). Furthermore, the useful apparent activity per unit area of the source, $A'_{app}$, is considered to be half of the apparent activity per unit area if only half of the radiation is directed to a single microbattery array. The useful apparent activity per unit area, $A'^{app}$, is given by:

$$A'_{app}[MBq/mm^2] = \frac{A_{app}}{2}$$

resulting in 1.94 MBq/mm$^2$ being emitted towards a single microbattery array (the other half emitted towards the other microbattery array).

Each diode cell of the microbattery is considered rectangular with an area of 0.8 mm×0.8 mm. The activity incident on each cell, $A_{inc}$, is given by:

$$A_{inc}[Bq] = A'_{app} S_{det}$$

where $S_{det}$ is the area of the diode cell in mm$^2$.

The short circuit current of each diode cell is given by:

$$I_{SCpp} = \Sigma_i \frac{A_{inc} QE_i E_i}{\omega}$$

where $E_i$ is the energy of the ith incident electron at the face of the cell in eV, $QE_i$ is the quantum efficiency of the cell at the energy of the ith incident electron and ω is the electron-hole pair creation energy of the cell material.

The quantum efficiency of the cell is a function of electron energy and can be found with simulations. It depends on the dead layers prior to the active layer, the thickness of the active layer and any dead layer after the active layer. By reducing the thickness of any top dead layers (for example the top contacts) and the p+ layer of a p+-i-n+ diode cell, and by optimising the thickness of the active i-layer, the quantum efficiency can be close to 100%. The top contacts may be designed such that the area open to illumination from the radioactive material is as large as possible. Interdigitated contacts may be used to facilitate this. The thickness of the p+ layer may be reduced down to 0.1 µm, resulting in minimum beta particles loss, especially at the high end of the beta energy profile. Assuming a quantum efficiency of 100% for simplification, the short circuit current per cell is 0.96 nA.

Once the short circuit current per cell is calculated, the open circuit voltage per cell, $V_{OCpp}$, can be calculated according to:

$$V_{OCpp} = \frac{1}{\beta} \ln\left(\frac{I_{ph}}{I_{SAT}} + 1\right)$$

where $I_{ph}$ is the illuminated current and equals $I_{SC}$ for zero applied bias, and $I_{SAT}$ is the saturation current. The saturation current can either be extracted from the current measurement as a function of applied forward bias, or can be theoretically calculated from:

$$I_{SAT} = S_{det} q N_C N_V \left(\frac{1}{N_A}\sqrt{\frac{D_n}{t_n}} + \frac{1}{N_D}\sqrt{\frac{D_p}{t_p}}\right) e^{\frac{-E_g}{nkT}}$$

where $N_c$ and $N_v$ are the effective densities of the state of the electrons in the conduction band and holes in the valence band respectively, $N_A$ and $N_D$ are the acceptor and donor concentration respectively, $D_n$ and $D_p$ are the electron and hole diffusion coefficients respectively, $t_n$ and $t_p$ are the electron and hole lifetimes respectively, $E_g$ is the bandgap of the semiconductor material, and n is the ideality factor of the diode cell. Here, a value of $I_{SAT}$ of $2.9 \times 10^{-17}$ A was used (such value was experimentally found for a 2 µm i-layer AlInP p-i-n diode). Thus, each cell was found to have an open circuit voltage of 0.53 V.

The total number of cells required in each array, $N_{tot}$, based on the above requirements is given by:

$$N_{tot} = \frac{V_{OC}}{V_{OCpp}} \frac{I_{SC}}{I_{SCpp}} = 3 \times 108$$

Each array may comprise three subunits connected in series, wherein each subunit has 108 diode cells connected in parallel.

The size of each microbattery array was therefore calculated to be $\sqrt{N_{tot}} \times \sqrt{N_{tot}} = 18$ pixels×18 pixels. As each diode cell was assumed to have an area of 0.8 mm×0.8 mm, the area of the array is 14.6 mm×14.6 mm (the distance between each cell is only 15 µm). The area of the $^{63}$Ni radioisotope source between the arrays may match. Thus, the $^{63}$Ni radioisotope source may have an initial activity of 1.7 GBq and an area of 14.6 mm×14.6 mm.

Figure 19:
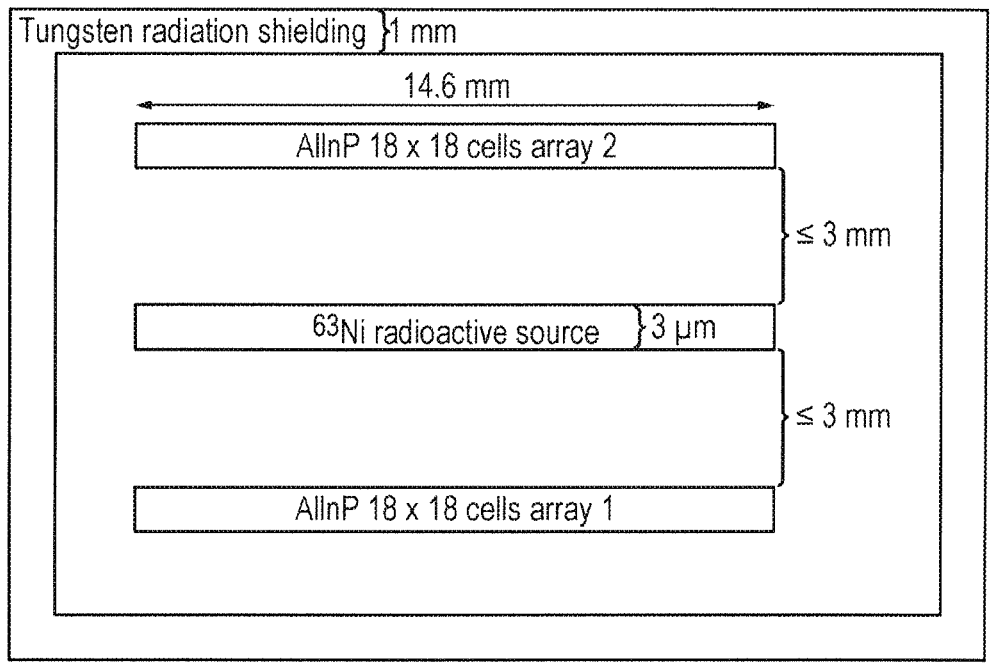
FIG. 19 shows a schematic of a microbattery having arrays of diode cells arranged on either side of the radioactive material.

FIG. 19 shows a schematic of the microbattery having the two arrays of diode cells arranged on either side of the radioactive material. The microbattery may have an external housing for preventing radiation from the radioactive material from exiting the microbattery. For example, the housing may be made from tungsten. The regions between the radioactive material and the diodes may be maintained at a pressure below atmospheric pressure and/or a gas other than air may be introduced into these regions (e.g. Helium).

Figure 20:
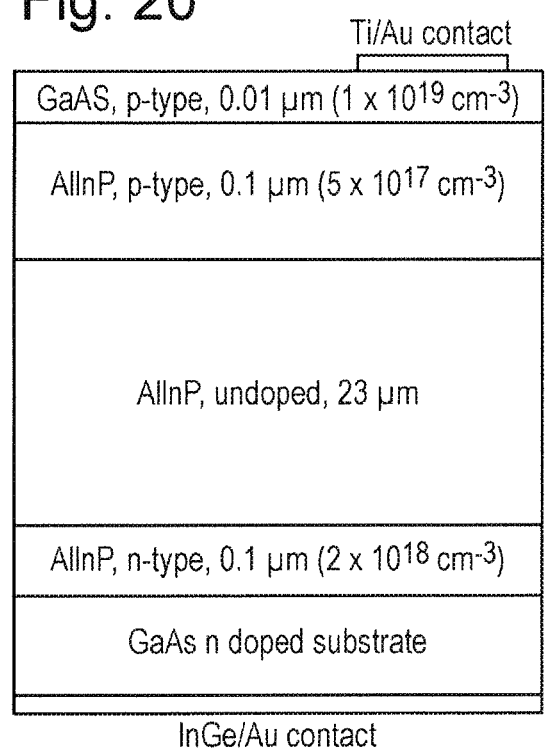
FIG. 20 shows a schematic of a diode cell according to an embodiment.

FIG. 20 shows a schematic of a diode cell according to an embodiment. The AlInP epilayer of the cell may be grown by metalorganic vapour phase epitaxy (MOVPE) on a commercial (1 0 0) n-GaAs:Si substrate with a misorientation of 10 degrees towards <1 1 1> A to suppress the CuPt-like ordered phase. The doping concentrations of the AlInP p$^+$ and n$^+$ layers may be $5 \times 10^{17}$ cm$^{-3}$ and $2 \times 10^{18}$ cm$^{-3}$, respectively. The thicknesses of the layers may be 0.1 µm for the p$^+$-region, 23 µm for the i-region and 0.1 µm for the n$^+$-region. After growth, the wafer may be processed to form square (with rounded corners) mesa structures using 1:1:1 $H_3PO_4:H_2O_2:H_2O$ solution followed by 10 s in 1:8:80 $H_2SO_4:H_2O_2:H_2O$ solution. An Ohmic rear contact, e.g. comprising 20 nm of InGe and 200 nm of Au, may be evaporated onto the rear of the substrate and an Ohmic top contact comprising, e.g. 20 nm of Ti and 200 nm of Au, may be evaporated on the p-side of the mesa device. The top Ohmic contact may only partially covers (e.g. 25%) the surface of each cell so that photons or particles incident on the cell are not attenuated by the contact.

Figure 21:
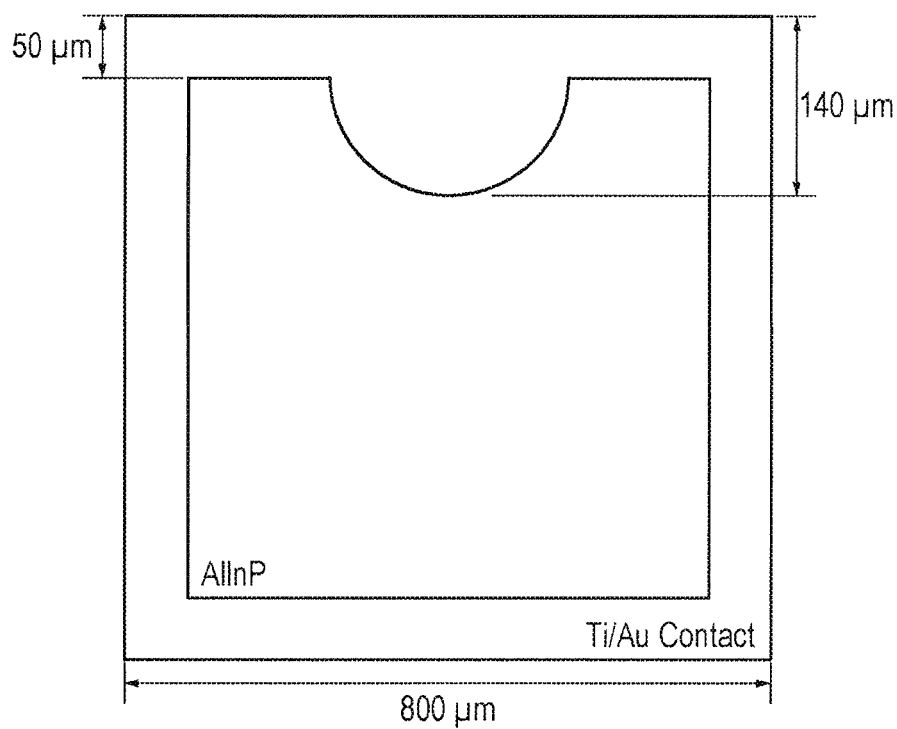
FIG. 21 shows a schematic top down view of a cell, showing the top ohmic contact.

FIG. 21 shows a schematic top down view of a cell, showing that the top ohmic contact extends only around the perimeter of the cell. However, other configurations having large open areas are contemplated, such as interdigitated contacts. As an example, interdigitated contacts with 0.002 mm width and 0.01 mm inter pixel distance could be used, covering only 17% of the surface of each cell.

Although an exemplary embodiment has been described above based on certain microbattery requirements ($V_m$=1.5 V and a current $I_m$=160 nA), it is contemplated that the microbattery may have other values of such requirements. Also, the values of the various parameters described may be varied to meet these requirements. For example, the purity of the of the radioactive source may be increased, enabling the number of cells and size of each array to be reduced.

Although square or rectangular diode cells have been described (which may or may not have rounded corners), other cell shapes may be used. For example, in order to avoid potential edge breakdown problems (which could be present at the corners of square cells if inadequately rounded at the corners), and to reduce the overall distance covered by any two adjacent cells (which would increase for circular cells), the cells may be the shape of a polygon having five, six or more sides.

Although mesa diodes have been described, planar diodes may be used (e.g. to avoid high surface leakage current). In these embodiments, ion implantation is used to form zones of high electrical resistivity separating the individual diode cells of the array.

Although embodiments have been described in which the radioactive material is arranged on the p-side of the diode, it is contemplated that it may be arranged on the n-side. In such embodiments, the substrate (e.g. GaAs substrate) may be etched from the wafer, possibly either leaving only a thin layer of substrate to mechanically connect the diodes, or alternatively using the n-type epilayer layer to mechanically connect the diodes in each array (possibly with the epilayers either not being fully etched through the n layer, and/or possibly with the n type epilayer thickness increased to provide mechanical support). The n-side contact may then be applied to this layer, and the radioisotope source may be brought into near or direct proximity with it.

The invention claimed is:

1. A nuclear battery comprising:
   a radioactive material that emits photons or particles; and
   at least one diode comprising a semiconductor material arranged to receive and absorb photons or particles and generate electrical charge-carriers in response thereto, wherein said semiconductor material is a crystalline lattice structure comprising Aluminium, Indium and Phosphorus, wherein the lattice structure has a lattice composition $Al_{0.52}In_{0.48}P$ or $Al_{0.53}In_{0.47}P$, and wherein the at least one diode comprises a PIN junction or p-n junction formed by said crystalline lattice structure; and
   wherein the nuclear battery either:
   (i) is configured to directly convert the photons or particles emitted from the radioactive material to said electrical charge-carriers; or
   (ii) comprises a converter for absorbing or interacting with the photons or particles emitted by the radioactive material and generating other types of photons or particles in response thereto, wherein the semiconductor material is arranged to receive and absorb said other types of photons or particles and generate the electrical charge-carriers in response thereto.

2. The battery of claim 1, comprising electrodes for collecting an electrical current generated by said at least one diode due to the generation of said electrical charge-carriers.

3. The battery of claim 1, wherein said at least one diode comprises a plurality of the diodes electrically connected in parallel or series.

4. The battery of claim 1, wherein said at least one diode comprises a plurality of the diodes, wherein one or more of the diodes is arranged on a first side of the radioactive material, and wherein one or more of the diodes is arranged on a second, opposite side of the radioactive material.

5. The battery of claim 1, wherein a gap is arranged between said at least one diode and the radioactive material, and wherein the gap is filled with a gas maintained at sub-atmospheric pressure.

6. The battery of claim 1, wherein a gap is arranged between said at least one diode and the radioactive material, and wherein the gap is filled with a noble gas.

7. The battery of claim 1, wherein a gap is arranged between said at least one diode and the radioactive material, and wherein the gap is filled with a radioactive gas.

8. The battery of claim 1, wherein said radioactive material and at least one diode are housed within a common housing, and wherein said housing is arranged and configured to substantially prevent said photons or particles from the radioactive material from leaving the housing; or
   wherein the micro-battery comprises a shield member arranged and configured to substantially prevent said photons or particles from the radioactive material passing through the shield member.

9. The battery of claim 1, wherein the i-layer of the PIN junction has a thickness of: ≥5 µm, ≥10 µm, ≥15 µm, ≥20 µm, ≥25 µm, ≥30 µm, ≥35 µm, ≥40 µm, ≥45 µm, or ≥50 µm; and/or
   wherein the i-layer of the PIN junction has a thickness of: ≤50 µm; ≤45 µm; ≤40 µm; ≤35 µm; ≤30 µm; ≤25 µm; ≤20 µm; ≤15 µm; ≤10 µm; or ≤5.

10. The battery of claim 1, wherein the p-layer and/or n-layer of the PIN junction has a thickness of: ≤0.5 µm, ≤0.4 µm, ≤0.3 µm, ≤0.2 µm, or ≤0.1 µm.

11. The battery of claim 1, comprising an electrode on either side of the PIN junction or p-n junction for applying a voltage across the junction and/or for collecting an electrical current due to the charge-carriers generated in the junction, wherein at least one of the electrodes does not cover a portion of the side of the junction on which it is located such that said photons or particles can pass into the junction through said side without passing through said at least one electrode.

12. The battery of claim 11, wherein said at least one electrode is annular, apertured, recessed or interdigitated so as not to cover the entirety of said side and to allow said photons or particles to pass into the junction without passing through the material forming the electrode.

13. The battery of claim 11, wherein said at least one electrode covers ≤x % of the area of said side of the junction on which it is located, wherein x is selected from: 40; 35; 30; 25; 20; 15 and 10.

14. The battery of claim 1, wherein the surface of each of the at least one diode facing the radioactive material is substantially polygon shaped.

15. The battery of claim 14, wherein the polygon shaped surface has rounded corners.

16. The battery of claim 14, wherein the polygon shaped surface has at least 5 sides or at least 6 sides.

17. The battery of claim 1, wherein the radioactive material is located within X mm of the diode semiconductor material, wherein X is selected from: ≤5; ≤4; ≤3; ≤2; ≤1; ≤0.8; ≤0.7; ≤0.6; ≤0.5; ≤0.4; ≤0.3; ≤0.2; and ≤0.1.

18. The battery of claim 1, wherein the radioactive material is a source of X-rays and/or gamma-rays or a source of beta particles and/or neutrons.

19. The battery of claim 1, wherein the radioactive material is a substantially planar mass having a mass thickness selected from: ≤10 mg/cm$^2$, ≤9 mg/cm$^2$, ≤8 mg/cm$^2$, ≤7 mg/cm$^2$, ≤6 mg/cm$^2$, ≤5 mg/cm$^2$, ≤4 mg/cm$^2$, ≤3 mg/cm$^2$, ≤2 mg/cm$^2$, and ≤1 mg/cm$^2$.

20. The battery of claim 1, wherein the radioactive material is a substantially planar mass having an apparent activity per unit area selected from: ≥1 MBq/mm$^2$; ≥2 MBq/mm$^2$; ≥3 MBq/mm$^2$; ≥4 MBq/mm$^2$; ≥5 MBq/mm$^2$; ≥6 MBq/mm$^2$; ≥7 MBq/mm$^2$; ≥8 MBq/mm$^2$; ≥9 MBq/mm$^2$; ≥10 MBq/mm$^2$; ≥12 MBq/mm$^2$; ≥14 MBq/mm$^2$; ≥16 MBq/mm$^2$; ≥18 MBq/mm$^2$; ≥20 MBq/mm$^2$; ≥25 MBq/mm$^2$; ≥30 MBq/mm$^2$; ≥35 MBq/mm$^2$; and ≥40 MBq/mm$^2$.

21. The battery of claim 1, wherein the at least one diode is a non-avalanche diode.

22. The battery of claim 1, wherein the battery does not comprise a current amplifier and does not amplify the current from the battery.

23. The battery of claim 1, wherein the battery comprises an outer package defining a battery volume of: ≤50 cm$^3$, ≤40 cm$^3$, ≤30 cm$^3$, ≤20 cm$^3$, ≤10 cm$^3$, ≤5 cm$^3$, ≤4 cm$^3$, ≤3 cm$^3$, ≤2 cm$^3$, or ≤1 cm$^3$.

24. A system comprising a battery as claimed in claim 1 and an electronic device connected to, or connectable to, the battery for being powered by the battery so as to perform one or more operation.

25. The battery of claim 1, wherein the battery comprises a GaAs substrate, and wherein said crystalline lattice structure is substantially lattice-matched to said GaAs substrate.

26. A nuclear battery comprising:
   a radioactive material that emits photons or particles; and
   at least one diode comprising a semiconductor material arranged to receive and absorb photons or particles and generate electrical charge-carriers in response thereto, wherein said semiconductor material is a crystalline lattice structure comprising Aluminium, Indium and Phosphorus, wherein a gap is arranged between said at least one diode and the radioactive material, and wherein the gap is filled with: (i) a gas maintained at sub-atmospheric pressure; or (ii) a noble gas; or (iii) a radioactive gas.

27. A nuclear battery comprising:

a radioactive material that emits photons or particles; and
at least one diode comprising a semiconductor material arranged to receive and absorb photons or particles and generate electrical charge-carriers in response thereto, wherein said semiconductor material is a crystalline lattice structure comprising Aluminium, Indium and Phosphorus, wherein the at least one diode comprises a PIN junction or p-n junction formed by said crystalline lattice structure; and wherein either:
   (a) the i-layer of the PIN junction has a thickness of: $\geq 5$ µm, $\geq 10$ µm, $\geq 15$ µm, $\geq 20$ µm, $\geq 25$ µm, $\geq 30$ µm, $\geq 35$ µm, $\geq 40$ µm, $\geq 45$ µm, or $\geq 50$ µm; and/or wherein the i-layer of the PIN junction has a thickness of: $\leq 50$ µm, $\leq 45$ µm, $\leq 40$ µm, $\leq 35$ µm, $\leq 30$ µm, $\leq 25$ µm, $\leq 20$ µm, $\leq 15$ µm, $\leq 10$ µm, or $\leq 5$; or
   (b) the p-layer and/or n-layer of the PIN junction has a thickness of: $\leq 0.5$ µm, $\leq 0.4$ µm, $\leq 0.3$ µm, $\leq 0.2$ µm, or $\leq 0.1$ µm.

28. A nuclear battery comprising:

a radioactive material that emits photons or particles; and
at least one diode comprising a semiconductor material arranged to receive and absorb photons or particles and generate electrical charge-carriers in response thereto, wherein said semiconductor material is a crystalline lattice structure comprising Aluminium, Indium and Phosphorus, wherein either:
(i) the radioactive material is a substantially planar mass having a mass thickness selected from: $\leq 10$ mg/cm$^2$, $\leq 9$ mg/cm$^2$, $\leq 8$ mg/cm$^2$, $\leq 7$ mg/cm$^2$, $\leq 6$ mg/cm$^2$, $\leq 5$ mg/cm$^2$, $\leq 4$ mg/cm$^2$, $\leq 3$ mg/cm$^2$, $\leq 2$ mg/cm$^2$, and $\leq 1$ mg/cm$^2$; or
(ii) the radioactive material is a substantially planar mass having an apparent activity per unit area selected from: $\geq 1$ MBq/mm$^2$; $\geq 2$ MBq/mm$^2$; $\geq 3$ MBq/mm$^2$; $\geq 4$ MBq/mm$^2$; $\geq 5$ MBq/mm$^2$; $\geq 6$ MBq/mm$^2$; $\geq 7$ MBq/mm$^2$; $\geq 8$ MBq/mm$^2$; $\geq 9$ MBq/mm$^2$; $\geq 10$ MBq/mm$^2$; $\geq 12$ MBq/mm$^2$; $\geq 14$ MBq/mm$^2$; $\geq 16$ MBq/mm$^2$; $\geq 18$ MBq/mm$^2$; $\geq 20$ MBq/mm$^2$; $\geq 25$ MBq/mm$^2$; $\geq 30$ MBq/mm$^2$; $\geq 35$ MBq/mm$^2$; and $>40$ MBq/mm$^2$.

* * * * *